United States Patent
Shinohara (12)

(10) Patent No.: US 10,978,503 B2
(45) Date of Patent: Apr. 13, 2021

(54) LIGHT DETECTION APPARATUS, PHOTOELECTRIC CONVERSION SYSTEM, AND MOVABLE BODY

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/565,114

(22) Filed: Sep. 9, 2019

(65) Prior Publication Data

US 2020/0091205 A1 Mar. 19, 2020

(30) Foreign Application Priority Data

Sep. 19, 2018 (JP) .............................. JP2018-175251

(51) Int. Cl.
*H01L 27/146* (2006.01)

(52) U.S. Cl.
CPC .... *H01L 27/1461* (2013.01); *H01L 27/14643* (2013.01)

(58) Field of Classification Search
CPC ........................ H01L 27/1461; H04N 3/1575
USPC ....................................................... 348/294
See application file for complete search history.

(56) References Cited

U.S. PATENT DOCUMENTS

| | | | |
|---|---|---|---|
| 4,368,385 A | 1/1983 | Kanbe | |
| 5,998,834 A * | 12/1999 | Williams | ............ H01L 29/7813 257/330 |
| 6,512,547 B1 | 1/2003 | Miida | |
| 8,823,124 B2 | 9/2014 | Pierschel | |
| 2009/0184384 A1 | 7/2009 | Sanfilippo | |
| 2013/0168793 A1 | 7/2013 | Ishibashi | |
| 2013/0207216 A1 | 8/2013 | Pierschel | |
| 2018/0108800 A1 | 4/2018 | Morimoto | |

FOREIGN PATENT DOCUMENTS

| | | |
|---|---|---|
| JP | 61-170079 A | 7/1986 |
| JP | 2007-266556 A | 10/2007 |
| JP | 2008-099174 A | 4/2008 |

\* cited by examiner

*Primary Examiner* — Joel W Fosselman
(74) *Attorney, Agent, or Firm* — Canon U.S.A., Inc. IP Division

(57) ABSTRACT

A light detection apparatus according to an embodiment includes a first semiconductor region having a first conductivity type, a second semiconductor region having a second conductivity type, a third semiconductor region having the first conductivity type, and a circuit unit configured to count the number of generation times of an avalanche current, wherein a reverse bias voltage for causing avalanche multiplication of the signal charge is applied to the second semiconductor region and the third semiconductor region, and the signal charge is accumulated in the first semiconductor region when the potential barrier is formed, wherein the control unit controls the height of the potential barrier.

25 Claims, 22 Drawing Sheets

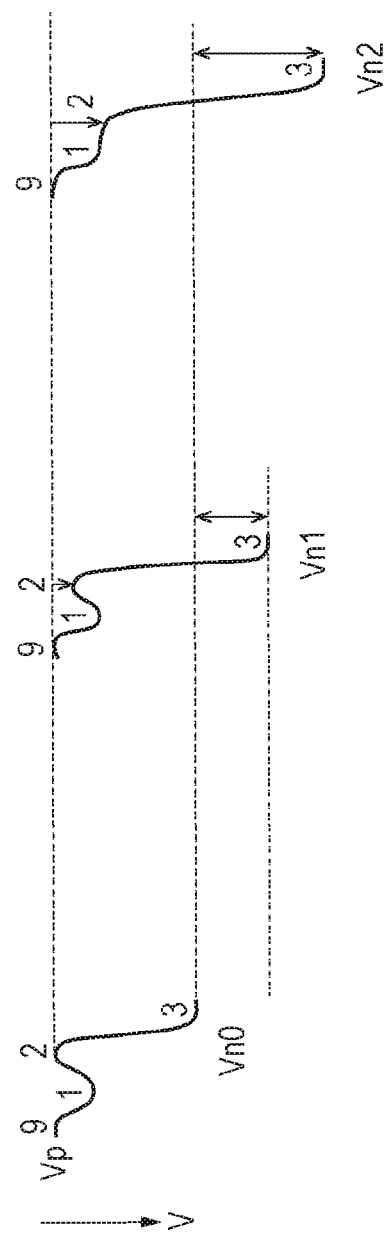

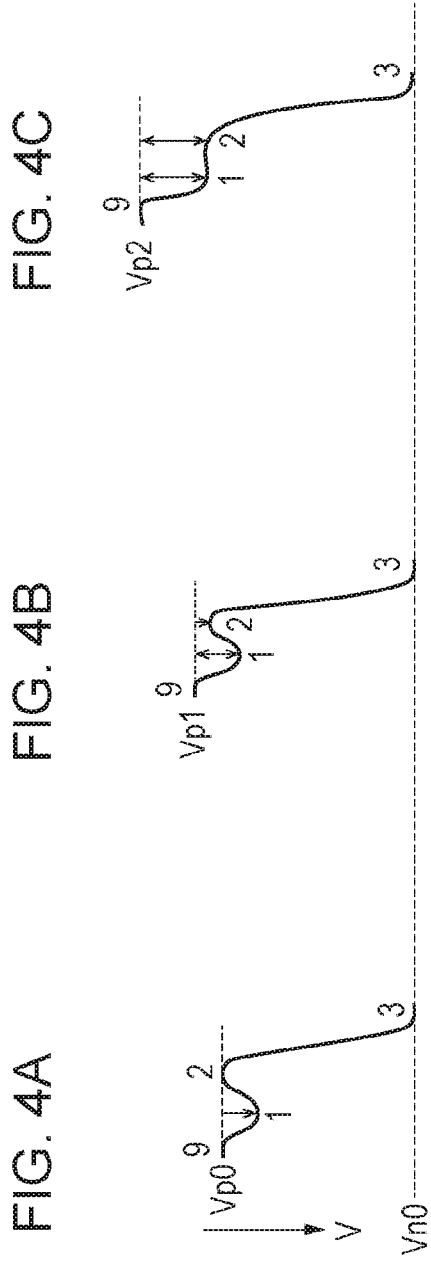

LIGHT DETECTION APPARATUS, PHOTOELECTRIC CONVERSION SYSTEM, AND MOVABLE BODY

BACKGROUND OF THE INVENTION

Field of the Invention

The present invention relates to a light detection apparatus, a photoelectric conversion system, and a movable body. The invention particularly relates to a light detection apparatus including a single photon avalanche diode (SPAD).

Description of the Related Art

A light detection apparatus including a SPAD has been known. The SPAD is an element configured to count the number of incident photons by detecting an avalanche current that has been generated upon incidence of a single photon on an avalanche diode (hereinafter, referred to as an AD). A reverse bias voltage having a magnitude higher than or equal to a breakdown voltage is applied to the AD, and a current is multiplied by avalanche multiplication. The light detection apparatus including the SPAD counts the number of occurrences when the current multiplied by the avalanche multiplication (hereinafter, referred to as "an avalanche current") exceeds a threshold.

U.S. Patent Application Publication No. 2009/0184384 describes a SPAD. Generation of a signal charge by photon incidence and avalanche multiplication of the generated signal charge are performed in the same region in the SPAD described in U.S. Patent Application Publication No. 2009/0184384. Specifically, the generation of the signal charge and the avalanche multiplication are performed in a depletion layer where only an electric field in a direction towards a charge collection region is generated. In accordance with the above-described configuration, the avalanche current is generated immediately when the signal charge is generated. However, for this reason, application of a reverse bias voltage having such a magnitude that the avalanche multiplication occurs is regularly performed during an incident light detection period in the SPAD according to U.S. Patent Application Publication No. 2009/0184384.

The AD performs not only the avalanche multiplication of the signal charge generated by the photon incidence but also avalanche multiplication of a charge generated due to a factor different from the photon incidence (hereinafter, referred to as an "unwanted charge") in some cases. When the avalanche multiplication of the unwanted charge occurs, this becomes a cause of noise.

In general, as a reverse bias voltage to be applied to a P-N junction is higher, the generated amount of a leak current or the like becomes higher. For this reason, as a reverse bias voltage to be applied to the P-N junction is higher, the unwanted charge that may become a noise source is more likely to be generated. In addition, a generation source of the unwanted charge (such as a crystal defect) generally exists in the entirety of a semiconductor substrate, and the generation source of the unwanted charge also exists in a region where the avalanche multiplication occurs.

In the AD in which the generation of the signal charge and the avalanche multiplication are performed in the same region as in the SPAD according to U.S. Patent Application Publication No. 2009/0184384, when the incident light detection period is lengthened, a period in which the application of the large reverse bias voltage is performed is accordingly lengthened. As a result, there is a possibility that the avalanche multiplication of the generated unwanted charge occurs, and the number of detections thereof may be increased. Therefore, an issue occurs that the noise is likely to increase in the SPAD according to U.S. Patent Application Publication No. 2009/0184384.

SUMMARY OF THE INVENTION

A light detection apparatus according to an aspect of the present invention includes a first semiconductor region having a first conductivity type in which carriers having a first polarity that is the same polarity as that of a signal charge are set as majority carriers, a second semiconductor region having a second conductivity type in which carriers having a second polarity are set as majority carriers, and a third semiconductor region having the first conductivity type where the signal charge is transferred from the first semiconductor region, wherein a reverse bias voltage for causing avalanche multiplication of the signal charge is applied to the second semiconductor region and the third semiconductor region, a potential barrier having a height lower than the reverse bias voltage with respect to the signal charge in the first semiconductor region is formed between the first semiconductor region and the third semiconductor region, and the signal charge is accumulated in the first semiconductor region by forming the potential barrier, wherein the light detection apparatus comprises a control unit configured to transfer the signal charge in the first semiconductor region to the third semiconductor region in a manner that the height of the potential barrier is controlled, and a circuit unit configured to count the number of generation times of an avalanche current generated by the avalanche multiplication.

Further features of the present invention will become apparent from the following description of exemplary embodiments with reference to the attached drawings.

BRIEF DESCRIPTION OF THE DRAWINGS

FIGS. 2A to 2C represent potentials along IIA-IIA, IIB-IIB, and in FIGS. 1A to 1C.

FIGS. 4A to 4C represent potentials along IVA-IVA, IVB-IVB, and IVC-IVC in FIGS. 3A to 3C.

DESCRIPTION OF THE EMBODIMENTS

According to the following exemplary embodiments, an example in which an electron is used as a signal charge will be described. According to the following exemplary embodiments, a semiconductor region having a first conductivity type in which carriers having a first polarity are set as majority carriers is an N-type semiconductor region, and a semiconductor region having a second conductivity type in which carriers having a second polarity are set as majority carriers is a P-type semiconductor region. However, exemplary embodiments of the present invention in which a hole is used as the signal charge are also established. In this case, the N type and the P type are inverted.

In addition, a photoelectric conversion unit in the following descriptions refers to a pixel in the case of an imaging sensor. However, application of the exemplary embodiments of the present invention is not limited to the imaging sensor, and therefore the term "photoelectric conversion unit" is used.

First Exemplary Embodiment

Figure 1A:
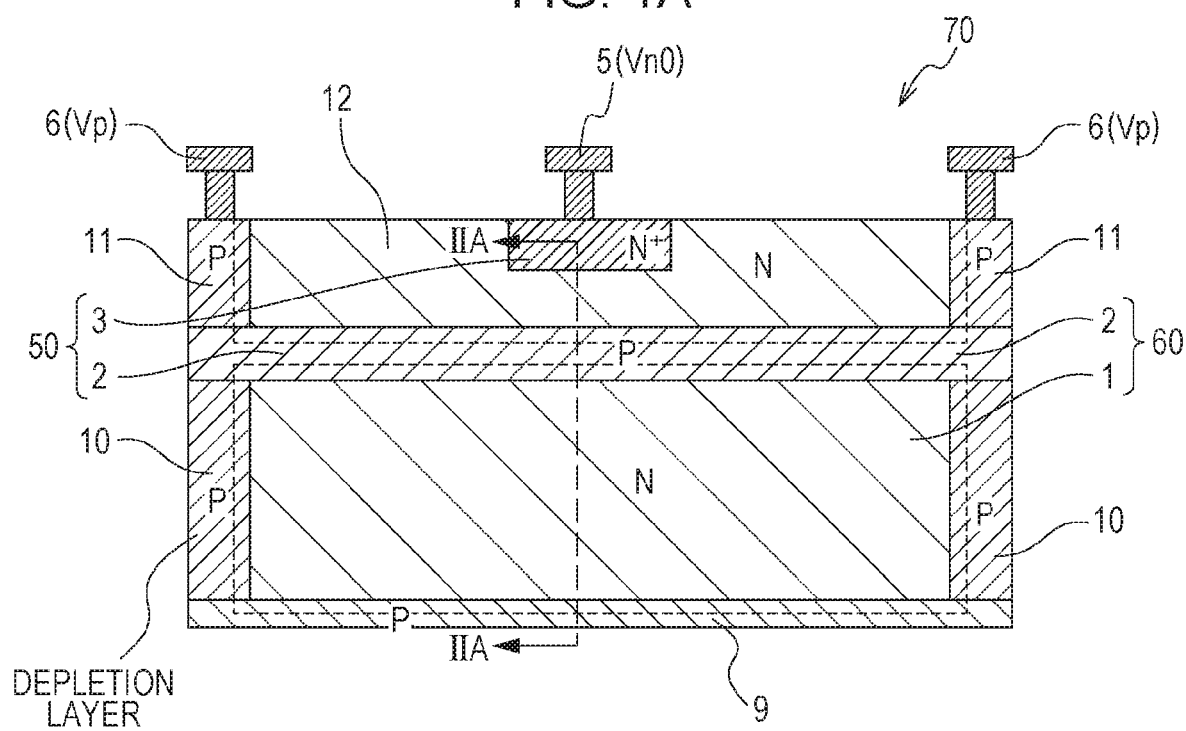
FIG. 1A is a schematic cross sectional view of a photoelectric conversion unit.
Figure 1B:
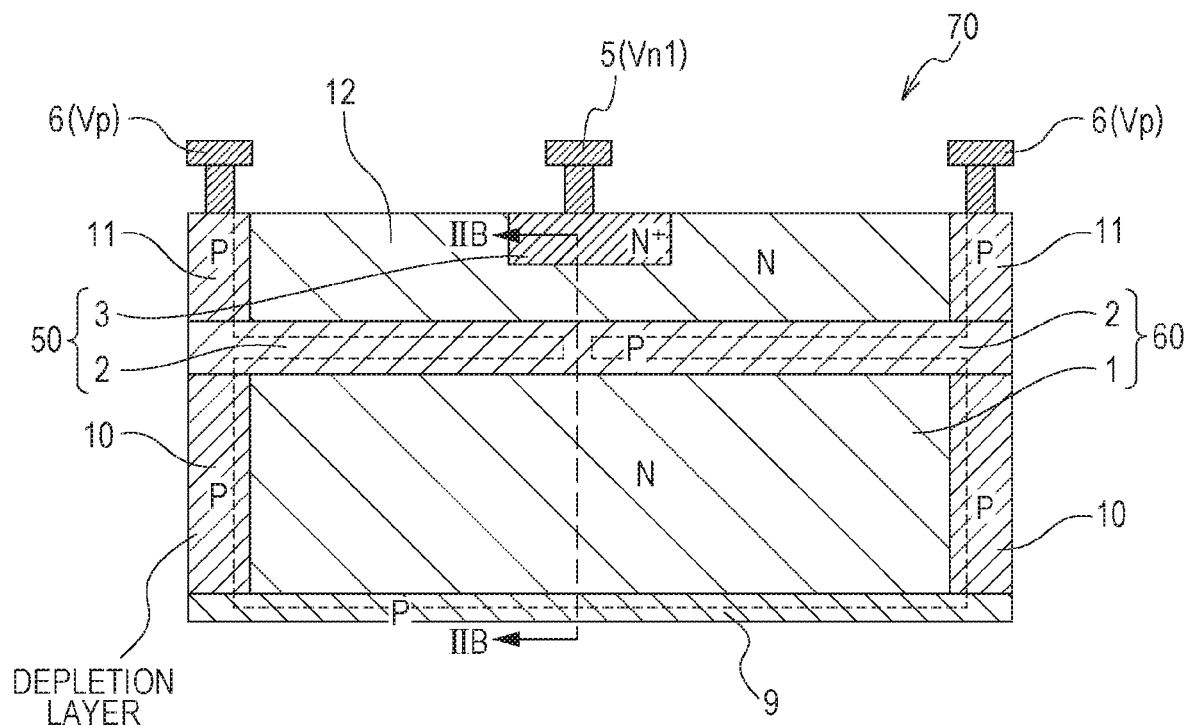
FIG. 1B is a schematic cross sectional view of the photoelectric conversion unit.
Figure 1C:
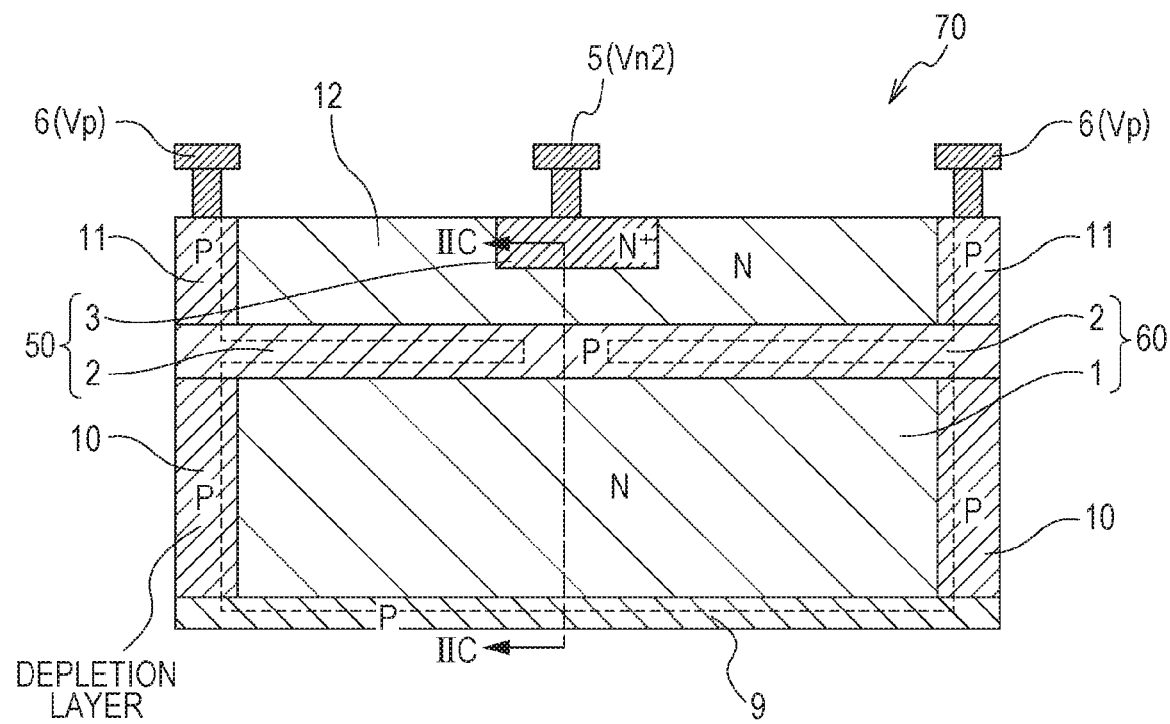
FIG. 1C is a schematic cross sectional view of the photoelectric conversion unit.

First, a photoelectric conversion unit included in a light detection apparatus will be described. FIGS. 1A to 1C schematically illustrate a cross sectional structure of a photoelectric conversion unit 70. As illustrated in FIGS. 1A to 1C, the photoelectric conversion unit 70 includes an N-type semiconductor region 1 (first semiconductor region), a P-type semiconductor region 2 (second semiconductor region), an N-type semiconductor region 3 (third semiconductor region), and an N-type semiconductor region 12 (seventh semiconductor region). The N-type semiconductor region 1 and the P-type semiconductor region 2 constitute a photodiode (PD) configured to convert light into a signal charge and accumulate the signal charge. The P-type semiconductor region 2, the N-type semiconductor region 3, and the N-type semiconductor region 12 constitute an avalanche diode (AD). As will be described below, the photoelectric conversion unit 70 takes a first state in which the signal charge is accumulated in the PD and a second state in which the signal charge accumulated in the PD is transferred to the AD. Avalanche multiplication is caused by the transferred signal charge in an AD section during at least part of a period in the second state.

The photoelectric conversion unit 70 further includes a P-type semiconductor region 9 formed on a semiconductor surface and a P-type semiconductor region 10 and a P-type semiconductor region 11 for separating the mutual adjacent photoelectric conversion units.

Arrangements for these semiconductor regions in the cross sectional structure are as illustrated in FIG. 1A and the like. In particular, the N-type semiconductor region 1 is surrounded by the P-type semiconductor regions 2, 9, and 10 (fourth semiconductor region). The P-type semiconductor region 2 is arranged at least partially between the N-type semiconductor region 1 and the N-type semiconductor region 3. The N-type semiconductor region 12 has a lower impurity concentration than the N-type semiconductor region 3 and is also arranged between the P-type semiconductor region 2 and the N-type semiconductor region 3. At least part of the N-type semiconductor region 12 forms an avalanche multiplication section. It should be noted that light is incident from an upper side of FIGS. 1A to 1C.

A potential control section 5 is connected to the N-type semiconductor region 3. The potential control section 5 applies a potential (electric potential) Vn to the N-type semiconductor region 3. A potential control section 6 is connected to the P-type semiconductor region 11. The potential control section 6 applies a potential Vp to the P-type semiconductor region 11. The potential Vp may also be supplied to the P-type semiconductor regions 2, 9, and 10 via the P-type semiconductor region 11. In the state illustrated in FIG. 1A, the N-type semiconductor region 1 is electrically floating.

A potential distribution inside the semiconductor substrate is determined by the above-described arrangements of the respective semiconductor regions, impurity concentration distributions of the respective semiconductor regions, and potentials applied to the potential control section 5 and the potential control section 6. Therefore, when the potentials applied to the potential control section 5 and the potential control section 6 are controlled, the first state and the second state described above can be switched. A potential state that will be described below is realized. In particular, the above-described arrangements of the respective semiconductor regions and the impurity concentration distributions of the respective semiconductor regions may be adjusted at the time of designing of the light detection apparatus so as to cause the avalanche multiplication precisely at the time of the signal charge transfer.

In FIGS. 1A to 1C and FIGS. 2A to 2C, a height of a potential barrier formed between the N-type semiconductor region 1 and the N-type semiconductor region 3 is changed by changing the potential applied to the N-type semiconductor region 3. With this configuration, the period in which the signal charge is accumulated in the N-type semiconductor region 1 (corresponding to the above-described first state) and the period in which the signal charge is transferred from the N-type semiconductor region 1 to the N-type semiconductor region 3 (corresponding to the above-described second state) are controlled. To make a principle of the operations more easily understandable, the fixed electric potential Vp is applied to the P-type semiconductor region 2 in FIGS. 1A to 1C.

FIG. 1A illustrates the photoelectric conversion unit 70 in a state in which the signal charge is accumulated in the N-type semiconductor region 1, and FIG. 2A illustrates a potential along IIA-IIA in FIG. 1A.

First, the potential Vn applied to the potential control section 5 is higher than the potential Vp applied by the potential control section 6. That is, a state is established in which a reverse bias is applied to the P-N junction. A depletion layer extends in the vicinity of a P-N junction surface. An edge of the depletion layer is illustrated by a broken line in FIGS. 1A to 1C. As illustrated in FIG. 1A, a neutral region exists in part of the P-type semiconductor region 2. A large number of holes corresponding to the majority carriers of the P-type semiconductor region in the neutral region in the P-type semiconductor region 2. For this reason, a potential in the neutral region in the P-type semiconductor region 2 is substantially the same as the applied potential Vp in the potential control section 6. It should be noted that the neutral regions also respectively remain in the P-type semiconductor regions 11, 10, and 9.

First, in a dark state, that is, in a case where the signal charge does not exist, the depletion layer extends in the entirety of the N-type semiconductor region 1 in FIG. 1A. At this time, a reverse bias voltage that is so-called "depletion voltage" is generated at least between the neutral region in the P-type semiconductor region 2 (neutral region in the other P-type semiconductor region existing in the surrounding) and the N-type semiconductor region 1. In other words, a potential barrier equivalent to a voltage obtained by adding a built-in potential between the P-N junctions in the surrounding to the depletion voltage is caused with respect to the signal charge (electron) existing in the N-type semiconductor region 1. Therefore, the potential barrier with respect to the electron in the N-type semiconductor region 1 is formed between the N-type semiconductor region 1 and the N-type semiconductor region 3 in the potential distribution along IIA-IIA as illustrated in FIG. 2A. It should be noted that the depletion voltage of the above-described PD is typically at the same level as a depletion voltage of a PD in an imaging sensor such as a complementary metal-oxide semiconductor (CMOS) sensor or a charge-coupled device (CCD), that is, it may be considered that the depletion voltage is approximately 1 V to 2 V.

In FIG. 1A, the potential Vn applied to the N-type semiconductor region 3 is set as Vn0. As described above, the potential Vn0 is higher than the potential Vp applied to the potential control section 6. Therefore, a reverse bias equivalent to a difference between the potential Vn0 and the potential Vp is applied to the P-N junction between the P-type semiconductor regions 2 and 11 and the N-type semiconductor regions 3 and 12. The depletion layer in accordance with the reverse bias also extends in the P-type semiconductor region 2 and the P-type semiconductor region 11. In this state of FIG. 1A, the potential Vn0 at which the avalanche multiplication is not caused is basically set at the P-N junction of the AD formed by the P-type semiconductor region 2 and the N-type semiconductor regions 3 and 12. The signal charge generated by the light incidence is accumulated in the N-type semiconductor region 1.

FIG. 1B illustrates a state in which the potential Vn applied to the N-type semiconductor region 3 is changed from Vn0 to Vn1 that is higher than Vn0.

Vn1 is a higher potential than Vn0, and Vp is fixed. For this reason, a higher reverse bias as compared with the case in FIG. 1A is applied to the P-N junction between the P-type semiconductor regions 2 and 11 and the N-type semiconductor regions 3 and 12. In response to this, the depletion layer in the P-type semiconductor region 2 is widened as compared with the case in FIG. 1A. As a result, when the potential Vn is Vn1, the depletion layer in the P-type semiconductor region 2 in the surrounding of the N-type semiconductor region 1 and the depletion layer in the P-type semiconductor region 2 in the surrounding of the N-type semiconductor region 3 are coupled to each other. In other words, the depletion layer is in a continuously extending state from the N-type semiconductor region 1 up to the N-type semiconductor region 3.

A potential at the depleting part in the P-type semiconductor region 2 is lower than a potential in the neutral region in the P-type semiconductor region 2 (substantially the same as Vp). This is because influences by the potential Vn applied to the N-type semiconductor region 3 are affected. Therefore, in the potential distribution along IIB-IIB in FIG. 1B, as illustrated in FIG. 2B, the height of the potential barrier between the N-type semiconductor region 1 and the N-type semiconductor region 3 is lowered as compared with the case in FIG. 1A.

At this time, almost the entire surrounding of the N-type semiconductor region 1 is surrounded by the neutral regions in the P-type semiconductor regions 2, 9, and 10. The applied potential Vp of the potential control section 6 is fixed. For this reason, a potential at a center of the N-type semiconductor region 1 hardly changes. Therefore, as described above, the height of the potential barrier with respect to the N-type semiconductor region 1 can be locally lowered.

In FIG. 1B, in a case where the signal charge is accumulated in the N-type semiconductor region 1, the signal charge starts to be transferred to the N-type semiconductor region 3 beyond the potential barrier. At this time, a reverse bias voltage to such an extent that the avalanche multiplication is caused is preferably set between the N-type semiconductor region 3 and the P-type semiconductor region 2.

After the continuous depletion layer is formed, the potential barrier is gradually lowered in accordance with the change of the potential Vn applied to the N-type semiconductor region 3 from Vn1 to a potential Vn2 that is higher than Vn1. The width of the depletion layer formed in the P-type semiconductor region 2 also changes in accordance with the change of the potential Vn.

FIG. 1C illustrates a state in which the potential barrier between the N-type semiconductor region 1 and the N-type semiconductor region 3 almost disappears. FIG. 2C illustrates a potential along IIC-IIC in FIG. 1C. At this time, the potential Vn2 is applied to the N-type semiconductor region 3. In the state of FIG. 1C, all the signal charges accumulated in the N-type semiconductor region 1 are transferred to the N-type semiconductor region 3. That is, complete depletion transfer can be performed.

A voltage used for the above-described complete depletion transfer is decreased as the impurity concentration in the P-type semiconductor region 2 is lower, and in contrast, the voltage is increased as the impurity concentration in the P-type semiconductor region 2 is higher. The impurity concentrations in the P-type semiconductor region 2 and the N-type semiconductor region 12 are set such that a reverse bias is generated to such an extent that the avalanche multiplication is caused in the P-type semiconductor region 2 and the N-type semiconductor region 3 during at least part of the period in which the signal charge is transferred as described above.

It should be noted that, in the dark state, it is considerable that the potential in the N-type semiconductor region 1 changes to some extent when the change from FIG. 1B to FIG. 1C occurs. However, since the P-type semiconductor region 2 is closer to the N-type semiconductor region 3 where the potential Vn is supplied than the N-type semiconductor region 1, the P-type semiconductor region 2 is more affected by the influences by the change of the potential Vn. The potential at the depleted part in the P-type semiconductor region 2 is more likely to be changed. As a result, the potential barrier between the N-type semiconductor region 1 and the N-type semiconductor region 3 can be eliminated.

According to the present exemplary embodiment, in FIG. 1C, a state is established in which the neutral region remains in the P-type semiconductor region 9 and the P-type semiconductor region 10. In accordance with this configuration, since the potential Vp can be supplied to a large part of the surrounding of the N-type semiconductor region 1, the change of the potential in the N-type semiconductor region 1 can be suppressed to be small in FIG. 2B and FIG. 2C. Therefore, even when the change amount of the potential Vn is small, the complete transfer of the charges can be performed. It should be noted that the entirety of the P-type semiconductor region 9 or the P-type semiconductor region 10 may be depleted in the progress of the change of the potential Vn from Vn0 to Vn2.

As described above, the height of the potential barrier between the N-type semiconductor region 1 and the N-type semiconductor region 3 can be controlled by controlling the potential Vn. Therefore, the light detection apparatus according to the present exemplary embodiment can selectively implement the operation for accumulating the signal charge in the N-type semiconductor region 1 and the operation for transferring the signal charge from the N-type semiconductor region 1 to the N-type semiconductor region 3 with this configuration.

Herein, the descriptions have been provided that the avalanche multiplication is preferably caused when the signal charge is transferred in FIG. 1B. However, while the potential Vn changes from Vn0 to Vn2, a timing of the application of the reverse bias at which the avalanche multiplication is caused and a timing of the coupling of the depletion layer in the P-type semiconductor region 2 (that is, a timing when the potential barrier starts to be lowered) may be shifted from each other. Either the timing of the application of the reverse bias at which the avalanche multiplication is caused or the timing of the coupling of the depletion layer in the P-type semiconductor region 2 may be ahead of the other timing. A saturated charge amount in the N-type semiconductor region 1 may be determined by the potential barrier at the time of a bias condition when signal detection can be started by the avalanche multiplication.

In the above-described explanation, the example in which the potential Vn applied to the potential control section 5 is controlled has been described. On the other hand, to change the height of the potential barrier between the N-type semiconductor region 1 and the N-type semiconductor region 3, the potential Vp applied to the P-type semiconductor region 2 may be changed while the potential Vn is fixed. According to the present exemplary embodiment, the height of the potential barrier is changed by changing Vp. In this case too, the period in which the signal charge is accumulated in the N-type semiconductor region 1 and the period in which the signal charge is transferred from the N-type semiconductor region 1 to the N-type semiconductor region 3 can be controlled.

A case where Vp is changed will be described with reference to FIGS. 3A to 3C and FIGS. 4A to 4C. To facilitate the descriptions, it is assumed in FIGS. 3A to 3C that a fixed positive potential VDD is applied to the N-type semiconductor region.

Figure 3A:
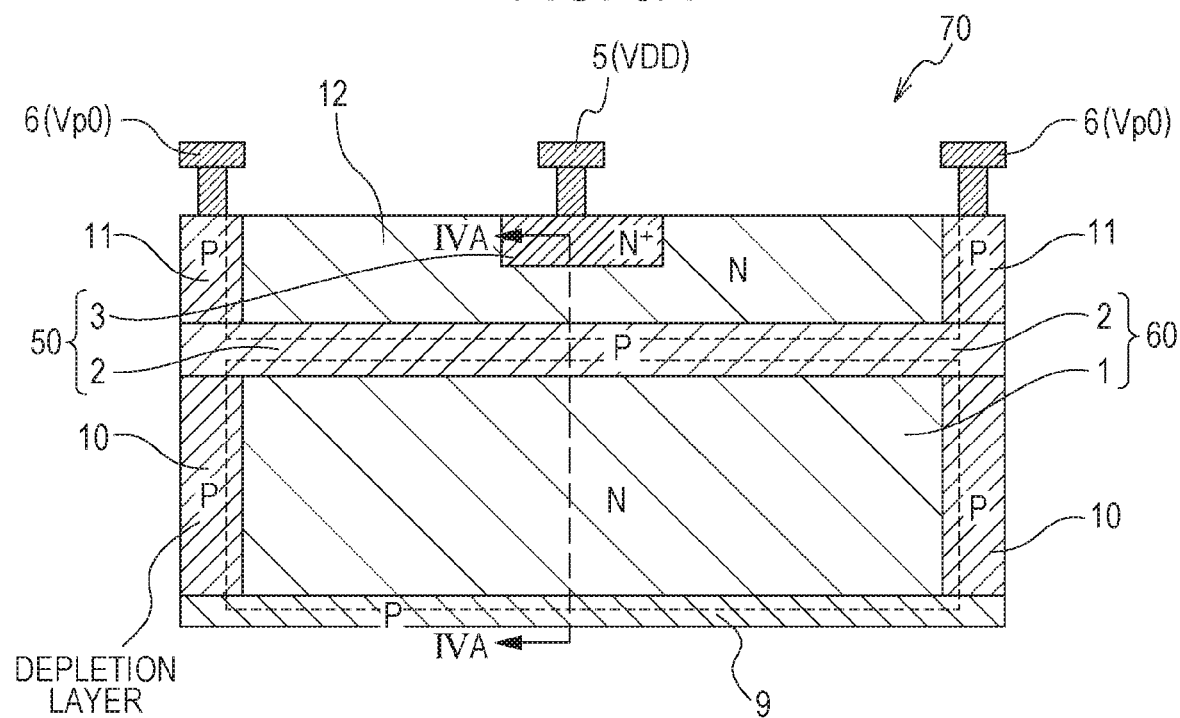
FIG. 3A is a schematic cross sectional view of the photoelectric conversion unit according to a first exemplary embodiment.

FIG. 3A illustrates the photoelectric conversion unit 70 in a state in which the signal charge is accumulated in the N-type semiconductor region 1, and FIG. 4A illustrates a potential along IVA-IVA in FIG. 3A. In FIG. 3A, a potential difference for the depletion voltage is caused between the P-type semiconductor region 2 and the N-type semiconductor region 1. At this time, Vp is set as Vp0. As illustrated in FIG. 3A, since the surrounding of the N-type semiconductor region 1 is surrounded by the P-type semiconductor region 2, the potential in the N-type semiconductor region 1 changes following the change of the potential in the P-type semiconductor region 2.

The potential change in a case where Vn is fixed and Vp is changed in this manner has been described. However, the potential distribution inside the semiconductor region is determined by a relative relationship between the potential of the potential control section 5 and the potential of the potential control section 6. Therefore, which one of the potential in the P-type semiconductor region 2 and the potential in the N-type semiconductor region 3 is changed to perform the control only depends on which one of the potentials will be simply set as a reference, and this is an equivalent configuration for P-N junction elements of the PD and the AD. For this reason, the explanations with reference to FIGS. 1A to 1C and FIGS. 2A to 2C are basically applied to FIGS. 3A to 3C and FIGS. 4A to 4C. Hereinafter, only main points in the respective drawings will be described.

Figure 3B:
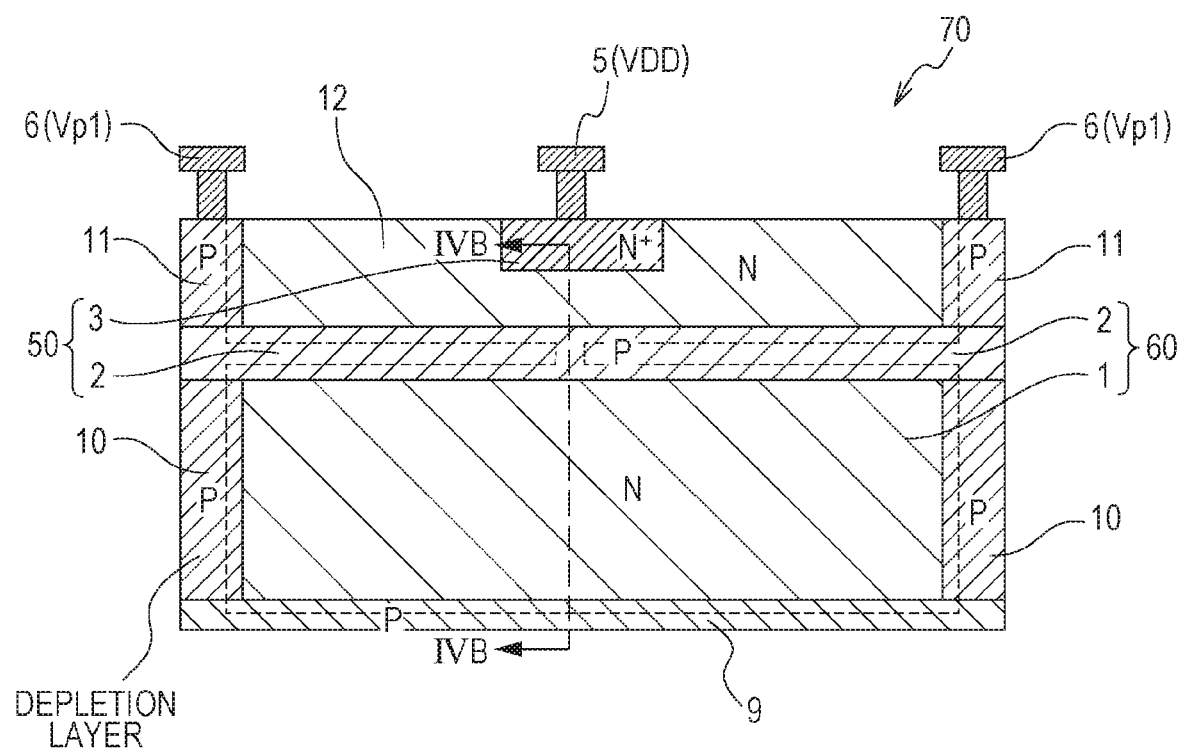
FIG. 3B is a schematic cross sectional view of the photoelectric conversion unit according to the first exemplary embodiment.

FIG. 3B illustrates a state in which the depletion layer in the P-type semiconductor region 2 in the surrounding of the N-type semiconductor region 1 and the depletion layer in the P-type semiconductor region 2 in the surrounding of the N-type semiconductor region 3 continuously extend. FIG. 4B illustrates a potential along IVB-IVB in FIG. 3B. At this time, the potential Vp1 that is lower than Vp0 is applied to the P-type semiconductor region 2. This state is similar to the state described with reference to FIG. 1B and FIG. 2B, and the potential barrier between the N-type semiconductor region 1 and the N-type semiconductor region 3 is being lowered. At this time, since almost the entire surrounding of the N-type semiconductor region 1 is surrounded by the neutral region in the P-type semiconductor region 2, the potential in the N-type semiconductor region 1 changes by approximately the same amount as Vp. As a result, the potential barrier between the N-type semiconductor region 1 and the N-type semiconductor region 3 is being lowered.

Figure 3C:
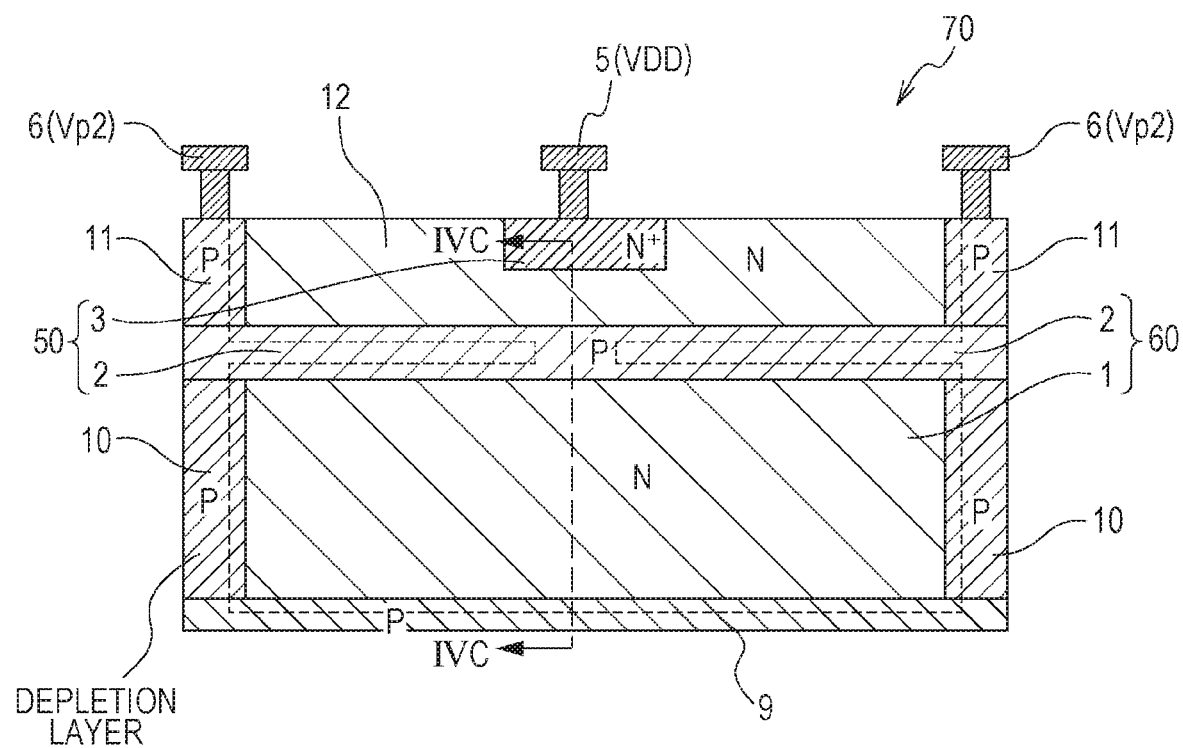
FIG. 3C is a schematic cross sectional view of the photoelectric conversion unit according to the first exemplary embodiment.

FIG. 3C illustrates a state in which the potential barrier between the N-type semiconductor region 1 and the N-type semiconductor region 3 disappears. FIG. 4C illustrates a potential along IVC-IVC in FIG. 3C. At this time, the potential Vp2 that is lower than Vp1 is applied to the P-type semiconductor region 2. Similarly as in the explanations with reference to FIG. 1C and FIG. 2C, in the state of FIG. 3C, all the signal charges accumulated in the N-type semiconductor region 1 are transferred to the N-type semiconductor region 3. That is, the complete depletion transfer can be performed.

Hereinafter, a case will be described where the photoelectric conversion unit 70 described above is used as the light detection apparatus, in particular, an imaging apparatus.

The light detection apparatus according to the first exemplary embodiment of the present invention will be described with reference to FIGS. 1A to 1C to FIG. 9.

Figure 5:
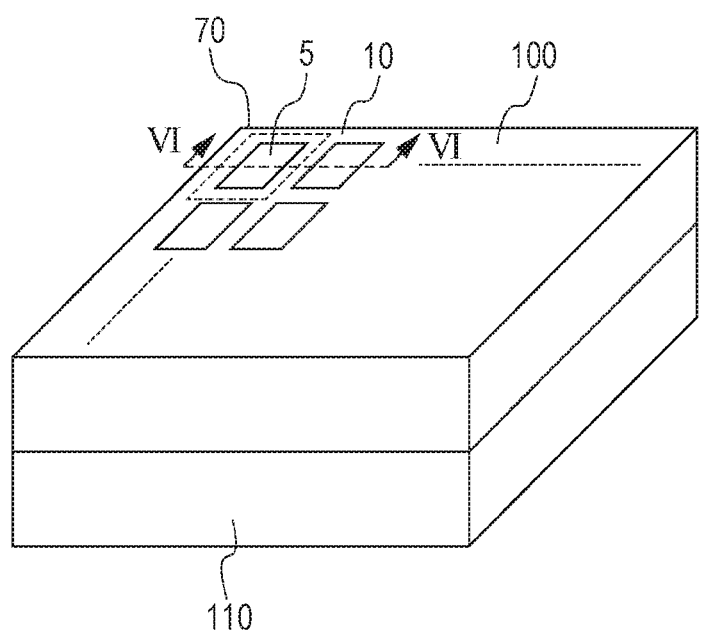
FIG. 5 is a schematic diagram of a light detection apparatus according to the first exemplary embodiment.
Figure 6:
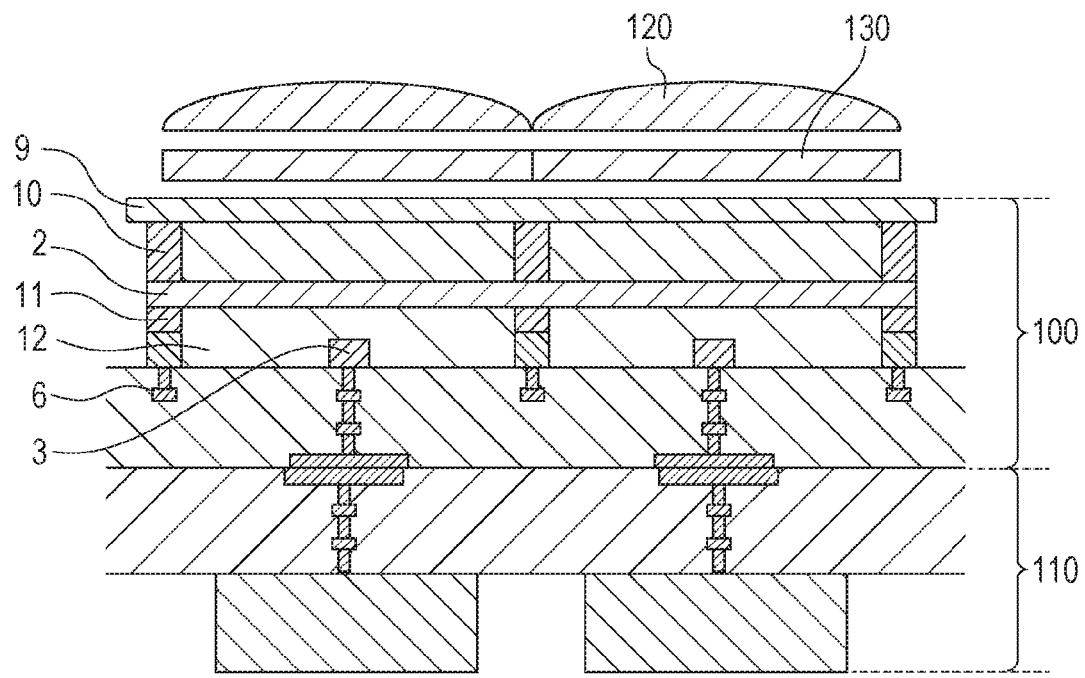
FIG. 6 is a cross sectional view of the light detection apparatus along VI-VI in FIG. 5.
Figure 7:
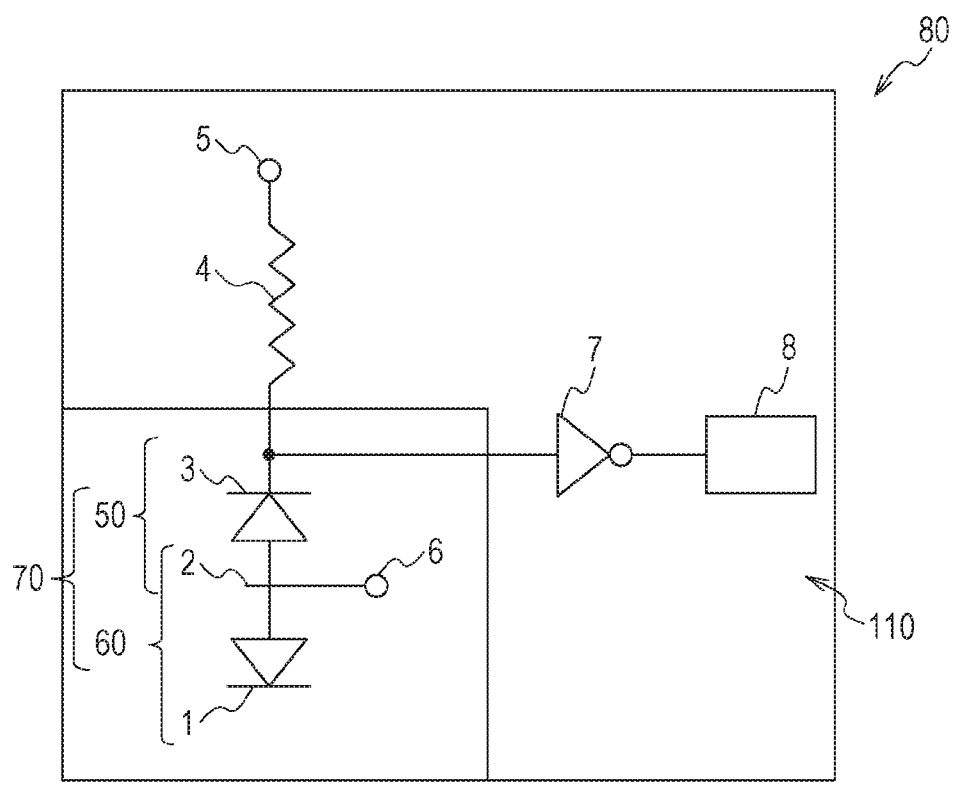
FIG. 7 is an equivalent circuit diagram of the light detection apparatus according to the first exemplary embodiment.
Figure 8:
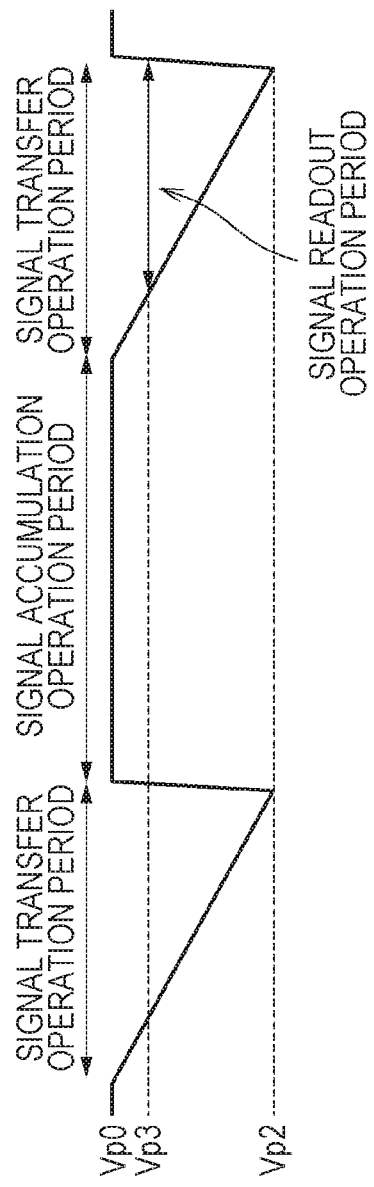
FIG. 8 is a timing chart for describing an operation of the photoelectric conversion unit according to the first exemplary embodiment.
Figure 9:
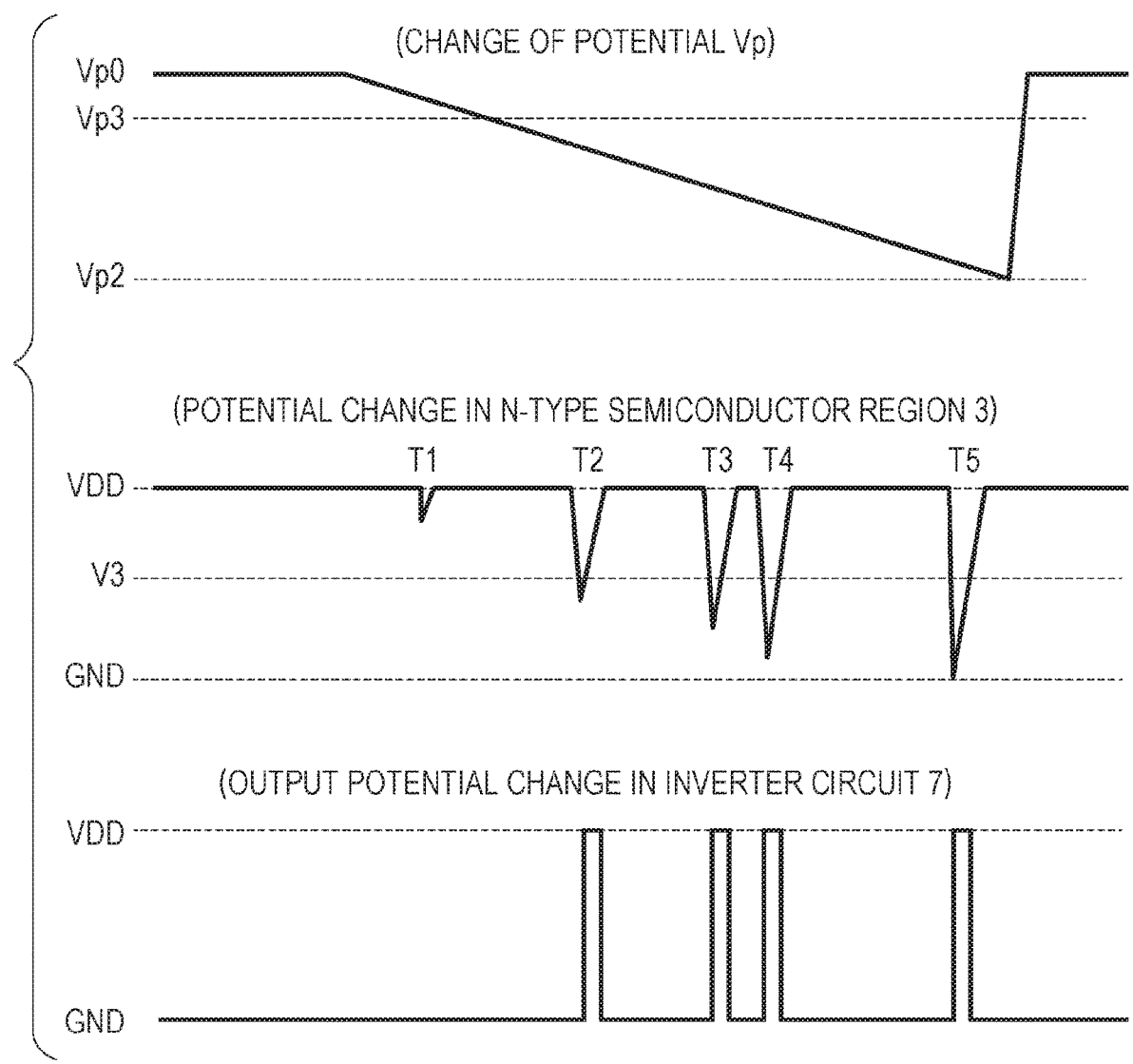
FIG. 9 illustrates a change of a potential in a signal transfer operation by the light detection apparatus according to the first exemplary embodiment.

FIG. 5 is a schematic diagram illustrating the light detection apparatus according to the present exemplary embodiment. FIG. 6 is a cross sectional view of the light detection apparatus along VI-VI in FIG. 5. FIG. 7 is an equivalent circuit diagram of a light detection element 80 included in the light detection apparatus. FIG. 8 is a timing chart for describing an operation of the photoelectric conversion unit 70. FIG. 9 illustrates a change of a potential in a signal transfer operation of the light detection element.

The light detection apparatus is constituted by laminating a plurality of substrates as illustrated in FIG. 5 and FIG. 6. For example, the light detection apparatus is constituted by laminating a substrate 100 including the plurality of photoelectric conversion units 70 and a substrate 110 including a counter circuit and an inverter circuit which will be described below on each other. The photoelectric conversion unit 70, the counter circuit, and the inverter circuit constitute the light detection element 80. That is, a circuit group constituting the single light detection element 80 is arranged while being separated into the substrate 100 and the substrate 110. With this configuration, increase in the area of the light detection apparatus in the plane view can be avoided while increase in speed or scale of a digital circuit including the counter circuit is realized.

It should be noted that a plurality of photoelectric conversion units and counter circuits may be arranged in parallel on a single substrate. As an alternative to the above-described configuration, the entirety of the light detection element 80 may be arranged on the single substrate.

According to the present exemplary embodiment, a first surface of the substrate 100 is a light incidence surface. In FIGS. 1A to 1C, FIGS. 3A to 3C, and FIG. 6, a surface on an upper side among two surfaces included in the substrate 100 is the first surface. That is, the light is incident on the light detection apparatus from the upper side in FIGS. 1A to 1C, FIGS. 3A to 3C, and FIG. 6. In a case where the exemplary embodiment of the present invention is applied to the imaging apparatus, as illustrated in FIG. 6, optical members such as a color filter 130 and a micro lens 120 are arranged at a side of the first surface of the substrate 100, that is, a side of the light incidence surface. A gate electrode of a transistor and a metallic wiring layer are arranged at a side of a second surface opposite to the first surface of the substrate 100. The substrate 110 is located at a side of the second surface of the substrate 100 with respect to the substrate 100. In the following descriptions, a side where light is incident is set as an upper side, and an opposed side is set as a lower side.

As illustrated in FIG. 6, the substrate 100 and the substrate 110 are affixed to each other on a junction surface. The junction surface is constituted by a metal such as copper and an insulator such as an oxide film. The metal constituting the junction surface may also constitute wiring that connects an element arranged on the substrate 100 such as the photoelectric conversion unit 70 to a circuit arranged on the substrate 110 such as a counter.

As illustrated in FIG. 7, the light detection element 80 includes the photoelectric conversion unit 70, an inverter circuit 7 functioning as a wave shaping unit, and a counter circuit 8. The light detection apparatus includes the plurality of light detection elements 80. For this reason, as explained with reference to FIG. 5, the photoelectric conversion unit 70 is arranged on the substrate 100. In accordance with this, the plurality of inverter circuits 7 and the plurality of counter circuits 8 are arranged on the substrate 110.

The photoelectric conversion unit 70 includes a photoelectric conversion section 60 (corresponding to the above-described PD) and a charge multiplication section 50 (corresponding to the above-described AD). The photoelectric conversion section 60 and the charge multiplication section 50 are respectively indicated by circuit symbols of diodes. An anode of the photoelectric conversion section 60 and an anode of the charge multiplication section 50 are connected to each other. In other words, the anode of the photoelectric conversion section 60 and the anode of the charge multiplication section 50 constitute a common node. The potential control section 6 is connected to the common node. According to the present exemplary embodiment, when the potential control section 6 controls a potential applied to the common node, the period in which the signal charge is accumulated in the photoelectric conversion section 60 and the period in which the accumulated signal charge is transferred to the charge multiplication section 50 are switched.

As illustrated in FIGS. 3A to 3C and FIG. 6, a cathode of the photoelectric conversion section 60 is constituted by the N-type semiconductor region 1. The anode of the photoelectric conversion section 60 and the anode of the charge multiplication section 50 are constituted by the P-type semiconductor region 2. A cathode of the charge multiplication section 50 is constituted by the N-type semiconductor regions 3 and 12. According to the present exemplary embodiment, a state in which the signal charge is transferred from the cathode of the photoelectric conversion section 60 to the cathode of the charge multiplication section 50 and a non-transfer state are controlled by controlling the potential applied from the potential control section 6 to the electric the P-type semiconductor region 2. For this reason, according to the present exemplary embodiment, the P-type semiconductor region 2 and the potential control section 6 correspond to a control unit. It should be noted that it is sufficient when the potential control section 6 has a function for performing the above-described potential control, and the specific circuit configuration is not particularly limited. For this reason, an exemplification thereof will be omitted herein.

The charge multiplication section 50 is an AD configured to perform multiplication of a photocurrent by performing the avalanche multiplication of the signal charge transferred from the cathode of the photoelectric conversion section 60 in the period in which the signal charge is transferred from the cathode of the photoelectric conversion section 60 to the cathode of the charge multiplication section 50. Although the detail will be described below, when a single signal charge among a plurality of signal charges generated in the photoelectric conversion section 60 is transferred to the charge multiplication section 50 in a state in which application of a reverse bias voltage is performed to such an extent that electron avalanche is formed, the signal charge is accelerated by an electric field generated by the N-type semiconductor region 3 and the P-type semiconductor region 2. Then, a current based on the plurality of electrons (and holes) is generated.

As described above, during at least part of the period in which the signal charge is transferred from the cathode of the photoelectric conversion section 60 to the cathode of the charge multiplication section 50, the reverse bias voltage to such an extent that the electron avalanche is caused is applied to the charge multiplication section 50. In other words, the reverse bias voltage having a magnitude higher than or equal to a breakdown voltage is applied to the charge multiplication section 50 during at least part of the period in which the signal charge is transferred. At this time, the charge multiplication section 50 basically operates in a Geiger mode. Therefore, the avalanche multiplication of the signal charge occurs. For example, in FIG. 7, the positive power source potential VDD is applied to the potential control section 5, and the negative potential Vp is applied to the potential control section 6. The potential VDD is supplied to the cathode of the charge multiplication section 50 through a resistance 4 in a state in which the avalanche current is not generated. For this reason, VDD−Vp becomes the reverse bias voltage applied to the charge multiplication section 50.

The resistance 4 is connected to the potential control section 5 and the cathode of the charge multiplication section 50. An operational relationship between the resistance 4 and the charge multiplication section 50 will be described. When the single signal charge is transferred to the charge multiplication section 50 in the period in which the reverse bias voltage to such an extent that the electron avalanche is caused is applied to the charge multiplication section 50, multiplication of the photocurrent occurs by the avalanche multiplication. A current obtained by the signal charge after the multiplication flows to a connection node of the charge multiplication section 50, the inverter circuit 7, and the resistance 4. The potential at the cathode of the charge multiplication section 50 decreases due to voltage drop based on this current, the electron avalanche is not formed in the charge multiplication section 50. With this configuration, the avalanche multiplication in the charge multiplication section 50 stops. Thereafter, since the potential VDD of the potential control section 5 is supplied to the cathode of the charge multiplication section 50 via the resistance 4, the potential supplied to the cathode of the charge multiplication section 50 returns to the potential VDD. That is, the operating region of the charge multiplication section 50 is set in the Geiger mode again.

One of roles of the resistance 4 is to temporarily stop the avalanche multiplication by the signal charge and to set the operative region of the charge multiplication section 50 in the Geiger mode again immediately after the stop.

The potential at the cathode of the charge multiplication section 50 decreases by the avalanche current by transferring the signal charge to the charge multiplication section 50. Since the cathode of the charge multiplication section 50 is connected to the inverter circuit 7, an output of the inverter circuit 7 becomes a Low level when the potential at the cathode is higher than the threshold of the inverter circuit 7. On the other hand, the output of the inverter circuit 7 becomes a High level when the potential at the cathode is lower than the threshold of the inverter circuit 7. That is, the output of the inverter circuit 7 is binarized. As a result, a rectangular pulse is output from the inverter circuit 7 in accordance with the presence of the signal charge that has been transferred from the N-type semiconductor region 1 to the N-type semiconductor region 3 and subjected to the avalanche multiplication.

The inverter circuit 7 is connected to a circuit unit configured to count the number of generation times of the avalanche current such as, for example, the counter circuit 8. The counter circuit 8 counts the number of pulses output from the inverter circuit 7 and outputs an accumulated count value. That is, when the pulse from the inverter circuit 7 is received, the counter circuit 8 changes the count value. As described above, the inverter circuit 7 generates the pulse on the basis of the presence or absence of the avalanche current generated by the avalanche multiplication. The counter circuit 8 counts the number of generation times of the avalanche current generated when at least one signal charge is transferred to the charge multiplication section 50 and also the avalanche multiplication is caused.

Next, the avalanche multiplication caused in the charge multiplication section 50 will be described. As described above, the charge multiplication section 50 includes the N-type semiconductor region 3, the N-type semiconductor region 12, and the P-type semiconductor region 2, and the N-type semiconductor region including the N-type semiconductor region 3 and the N-type semiconductor region 12 and the P-type semiconductor region 2 constitute the P-N junction.

The reverse bias voltage for causing the avalanche multiplication in the charge multiplication section 50 is applied to the P-N junction in the charge multiplication section 50 during at least part of the period in which the signal charge is transferred from at least the photoelectric conversion section 60. That is, a high electric field for accelerating the charge to such an extent that the avalanche multiplication is caused is generated in the depletion layer in the vicinity of the P-N junction in the charge multiplication section 50.

When one signal charge among the plurality of signal charges generated in the photoelectric conversion section 60 and accumulated is transferred to the depletion layer of the charge multiplication section 50, the single signal charge is accelerated by the above-described high electric field. With this configuration, a current based on the plurality of electrons (and holes), that is, an avalanche current is generated.

As already described, the voltage applied to the charge multiplication section 50 is controlled by controlling the potential applied to the N-type semiconductor region 3 or the P-type semiconductor region 2.

Hereinafter, the drive of the photoelectric conversion unit 70 will be described. In the following descriptions, it is assumed that the positive power source potential VDD is applied to the potential control section 5, and the negative potential Vp is applied to the potential control section 6, that is, the operation described with reference to FIGS. 3A to 3C and FIGS. 4A to 4C is performed.

FIG. 8 is a timing chart for describing the drive of the photoelectric conversion unit 70. In FIG. 8, the horizontal axis indicates the time, and the vertical axis indicates the potential Vp applied by the potential control section 6.

A time when the potential Vp is the potential Vp0 corresponds to a time when the charge multiplication section 50 is in a non-avalanche state. That is, the height of the potential barrier is restricted to a range where the avalanche multiplication of the signal charge is not caused. That is, the potential Vp0 is set such that the reverse bias voltage applied to the charge multiplication section 50 becomes lower than a minimum voltage for causing the avalanche multiplication. The potential barrier is formed between the N-type semiconductor region 1 and the N-type semiconductor region 3 when the potential Vp is the potential Vp0. For example, Vp0 is −18 V.

The potential control section 6 performs control such that the potential Vp is gradually decreased from the potential Vp0. When the potential Vp becomes lower than or equal to the potential Vp3, a state is established in which the charge multiplication section 50 causes the avalanche multiplication. In other words, in a case where the potential Vp is lower than or equal to the potential Vp3, the reverse bias voltage applied to the charge multiplication section 50 is higher than the breakdown voltage.

When the potential Vp is gradually decreased from the potential Vp0, the potential barrier between the N-type semiconductor region 1 and the N-type semiconductor region 3 is lowered. When the potential Vp reaches Vp2, the potential barrier between the N-type semiconductor region 1 and the N-type semiconductor region 3 disappears. In this state, all the signal charges accumulated in the photoelectric conversion section 60 are transferred to the charge multiplication section 50. For example, Vp3 is −20 V, and Vp2 is −25 V.

It should be noted that, according to the present exemplary embodiment, the potential Vp2 at which the potential barrier between the N-type semiconductor region 1 and the N-type semiconductor region 3 disappears is lower than the minimum potential Vp3 at which the avalanche multiplication is caused by the reverse bias voltage applied to the charge multiplication section 50. That is, when the potential Vp is decreased from Vp0, first, the charge multiplication section 50 is set in an avalanche state. Thereafter, the potential barrier between the N-type semiconductor region 1 and the N-type semiconductor region 3 disappears. This situation has been already described with reference to FIGS. 3A to 3C and FIGS. 4A to 4C.

As illustrated in FIG. 7, the photoelectric conversion unit 70 has a "signal accumulation operation period" in which the signal charge is accumulated in the photoelectric conversion section 60 and a "signal transfer operation period" in which the signal charge generated by the photoelectric conversion section 60 is transferred to the charge multiplication section 50 and read out.

During the signal accumulation operation period, Vp is Vp0, corresponding to the state illustrated in FIG. 3A and FIG. 4A. During the signal transfer operation period, the potential Vp is lower than Vp0 and also higher than or equal to Vp2, corresponding to the state illustrated in FIG. 3B and FIG. 4B and also FIG. 3C and FIG. 4C. The potential Vp is gradually decreased from Vp0 to Vp2 to transfer the signal charge during the signal transfer operation period. The signal transfer operation period includes a period in which the charge multiplication section 50 is in the non-avalanche state and a period in which the charge multiplication section 50 is in the avalanche state and the transferred signal charge is read out. The period of the non-avalanche state is a period in which the potential Vp is lower than the potential Vp0 and higher than the potential Vp3. The period in which the avalanche state is established and the transferred signal charge is read out is a period in which the potential Vp is lower than or equal to the potential Vp3. As illustrated in FIG. 8, the period in which the potential Vp is lower than or equal to the potential Vp3 is set as a "signal readout operation period".

During the signal readout operation period, the signal charges accumulated in the N-type semiconductor region 1 at a point in time when Vp=Vp3 is established are transferred to the N-type semiconductor region 3 and read out in a period in which Vp changes from Vp3 to Vp2. Since the plurality of signal charges are accumulated in the N-type semiconductor region 1, the potential is gradually changed from Vp3 to Vp2. That is, the change from Vp3 to Vp2 takes a predetermined period of time, and the potential is gradually decreased. When the plurality of signal charges are transferred to the charge multiplication section 50 substantially at the same time, count loss may occur since the number of counts by the counter circuit 8 becomes 1. In contrast to this, when the potential is gradually decreased, the plurality of signal charges are hardly transferred at the same time, the count loss hardly occurs. The potential is preferably changed in a slope manner as illustrated in FIG. 8 but may also be changed in a step manner.

FIG. 9 illustrates the change of the potential Vp during the signal transfer operation period, and the change of the potential in the N-type semiconductor region 3 and the change of the output potential of the inverter circuit 7 based on the change of the potential Vp. In FIG. 9, T1, T2, T3, T4, and T5 indicate timings when the signal charge is transferred from the N-type semiconductor region 1 to the N-type semiconductor region 3. That is, FIG. 9 represents a situation where five signal charges in total are transferred. As described above, the charge multiplication section 50 is set in the avalanche state upon application of the potential lower than or equal to Vp3.

In FIG. 9, at the point T1 in time, Vp does not yet reach Vp3. The inverter circuit 7 shapes the waveform when the potential in the N-type semiconductor region 3 is higher than or equal to a predetermined potential. For example, the predetermined potential is V3 in FIG. 9. When the potential lower than or equal to V3 is detected, the inverter circuit 7 shapes the waveform.

The signal charge transferred at T1 causes an impact ionizing current to some extent, but the potential lower than or equal to V3 is not obtained. At T1, since the potential in the N-type semiconductor region 3 does not reach the potential at which the waveform is shaped by the inverter circuit 7, the inverter circuit 7 does not shape the waveform. Therefore, the counter circuit 8 does not perform counting.

In FIG. 9, at T2, T3, T4, and T5 when Vp becomes the potential lower than Vp3, the respective signal charges to be transferred cause the avalanche current to set the potential in the N-type semiconductor region 3 to be lower than or equal to V3. Therefore, a count pulse is generated at the output of the inverter circuit 7 and counted in the counter circuit 8.

As may be understood from the above-described explanation, the period in which Vp changes from Vp0 to Vp2 is the signal transfer operation period in which the charge is transferred from the N-type semiconductor region 1 to the N-type semiconductor region 3. The other period becomes the signal accumulation operation period in which the signal charge is accumulated in the N-type semiconductor region 1. The period in which Vp changes from Vp3 to Vp2 in the signal transfer operation period is the signal readout operation period in which the charge transferred from the N-type semiconductor region 1 to the N-type semiconductor region 3 is counted as the signal charge. It should be noted that, to be precise, the signal accumulation is also performed in parallel with the signal transfer when the light incidence occurs even during the signal transfer operation period. On the other hand, during the signal accumulation operation period, only the signal accumulation is performed, and the signal transfer is not performed. It should be noted that a timing when the signal charge is actually started to be transferred in the signal transfer operation period illustrated in FIG. 8 corresponds to a timing when Vp falls slightly below Vp0, and the signal transfer operation period may partially include a period in which the signal is not transferred in some cases. In FIG. 9, a case where the potential of Vp at which the signal transfer starts is higher than Vp3 is assumed, and the transfer also occurs at the timing T1, but the potential of Vp at which the signal transfer is actually started may be lower than Vp3 in some cases.

Next, the effects of the present exemplary embodiment will be described. The photoelectric conversion unit 70 according to the present exemplary embodiment takes the first state in which the signal charge is accumulated in the photoelectric conversion section 60 and the second state in which the avalanche multiplication is caused by the signal charge transferred from the photoelectric conversion section 60 to the charge multiplication section 50. In accordance with the above-described configuration, a probability that an unwanted charge is counted can be reduced.

The signal charge is accumulated in the photoelectric conversion section 60 during the signal accumulation operation period. Thereafter, the signal charge is counted during at least part of the signal transfer operation period. While the signal charge is accumulated in the photoelectric conversion section 60 in these periods, the generated signal charge does not need to be counted. For this reason, the high reverse bias at which the avalanche multiplication is caused does not need to be applied to the photoelectric conversion section 60. Therefore, the signal charge can be accumulated in a state in which the generation of the unwanted charge is suppressed as compared with a case where the high reverse bias is regularly applied to the region where the signal charge is generated. Thereafter, the period in which the accumulated signal charges is read out is separately prepared, and as a result, the probability that the unwanted charge is counted can be reduced.

In one operation example according to the present exemplary embodiment, during the signal accumulation operation period, the reverse bias voltage for setting the charge multiplication section 50 in the non-avalanche state is applied to the charge multiplication section 50. With this configuration, the avalanche multiplication is not caused even when the unwanted charge is generated in the charge multiplication section 50 or the unwanted charge enters the charge multiplication section 50 in this period. For this reason, the probability can be reduced that more unwanted charges generated by the high electric field in the charge multiplication section 50 than the case of the low electric field are counted as noise. Therefore, the generation of the noise can be further reduced as compared with the related-art light detection apparatus that uses the avalanche multiplication such as the related-art SPAD in which many unwanted charges are generated by the application of the high electric field during the entire operation period, and also the generated unwanted charges are regularly counted. It should be noted that a voltage comparable with or lower than the reverse bias of the photoelectric conversion section 60 (depletion voltage in the N-type semiconductor region 1) may be applied to the charge multiplication section 50 as the reverse bias voltage for setting the charge multiplication section 50 in the non-avalanche state during the signal accumulation operation period.

In another operation example, the reverse bias voltage at which the charge multiplication section 50 is set in the avalanche state may be regularly applied to the charge multiplication section 50. In this case, the light detection element is configured in a manner that the avalanche current generated by the unwanted charge during a period other than the signal transfer operation period is not to be counted. A method of avoiding the counting of the avalanche current includes setting the inverter circuit 7 to be inactive, resetting the counter circuit 8 at the beginning of the signal readout period, or the like. In this case too, since the accumulation of the signal charge is performed in the photoelectric conversion section 60 that is separated from the charge multiplication section 50, the probability that the unwanted charge is counted can be reduced as described above.

To further increase the effects of the present exemplary embodiment, the signal readout operation period is preferably short. According to the present exemplary embodiment, the unwanted charge generated in the charge multiplication section 50 or the lower surface of the substrate 100 is counted only during the signal readout operation period. During the signal accumulation operation period, even when the unwanted charge is generated in the charge multiplication section 50 or the lower surface of the substrate 100, the unwanted charge is not accumulated in the N-type semiconductor region 1 because of the potential barrier by the P-type semiconductor region 2 and flows off to the N-type semiconductor region 3 without being counted. The signal readout operation period is preferably shorter than the signal accumulation operation period as described above, but in a case where the incident light is to be detected in a very short period of time, the signal accumulation operation period may be shorter than the signal readout operation period.

On the other hand, when the unwanted charge is generated on the upper surface of the substrate 100, the unwanted charge may be accumulated in the N-type semiconductor region 1, and the unwanted charge may be counted during the signal readout operation period. In contrast to this, the reverse bias applied to the N-type semiconductor region 1 is lower than the reverse bias applied to the charge multiplication section 50 in the avalanche state. In the related-art SPAD, the photoelectric conversion is also performed in the AD where a dark current generation speed is high because of the application of the high voltage. Therefore, according to the present exemplary embodiment, the photoelectric conversion section (PD) to which only the low reverse bias voltage is applied where the generation of the dark current can be thus suppressed is separated from the high electric field section (AD). For this reason, a period in which an unwanted dark electron generated in the AD is counted can be shortened as compared with the related art, and the unwanted charges can be reduced as compared with the related-art SPAD.

The dark current generation on the upper surface of the substrate 100 can be suppressed by an element structure. This is the same situation where the dark current is accumulated in the photodiode of the CMOS sensor, and the dark current is suppressed by use of a buried-type photodiode in the CMOS sensor. The generation of the dark current can be suppressed when the above-described buried-type photodiode is adopted as one of exemplary embodiments.

Hereinafter, descriptions will be provided on how the unwanted charges caused by the dark current or the like are reduced as one of additional effects attained by the present exemplary embodiment.

As illustrated in FIGS. 1A to 1C and FIGS. 3A to 3C, the N-type semiconductor region 1 is surrounded by the P-type semiconductor regions 2, 9, and 10 and has the buried structure similarly as in the photoelectric conversion section of pixels in the so-called CMOS sensor. Since the generation source of the unwanted charge particularly exists on the surface of the substrate 100, when the N-type semiconductor region 1 is spaced from the surface of the substrate 100, it is possible to establish a state in which the dark current is hardly generated. For this reason, the P-type semiconductor region 9 is set to have a concentration at which a semiconductor interface section is not depleted. As described above, in a case where the impurity concentration in the P-type semiconductor region 2 is set to be low for the complete depletion transfer, the impurity concentration in the P-type semiconductor region 9 may be higher than the impurity concentration in the P-type semiconductor region 2 as a result in some cases. Since the P-type semiconductor region 10 is arranged on a side surface of the N-type semiconductor region 1, crosstalk between the adjacent photoelectric conversion units 70 can be reduced.

It should be noted that, according to the present exemplary embodiment, the P-type semiconductor region 9 constituting part of the surface of the substrate 100 is arranged on the upper surface of the N-type semiconductor region 1. The configuration is not limited to this, and a negative fixed charge film may be arranged on the upper surface of the N-type semiconductor region 1, and a hole accumulation layer may be formed in the vicinity of the upper surface of the substrate 100 in the N-type semiconductor region 1. In this case too, the dark current is hardly generated. For example, hafnium oxide, aluminum oxide, tantalum oxide, and the like can be used as the negative fixed charge film.

Figure 10:
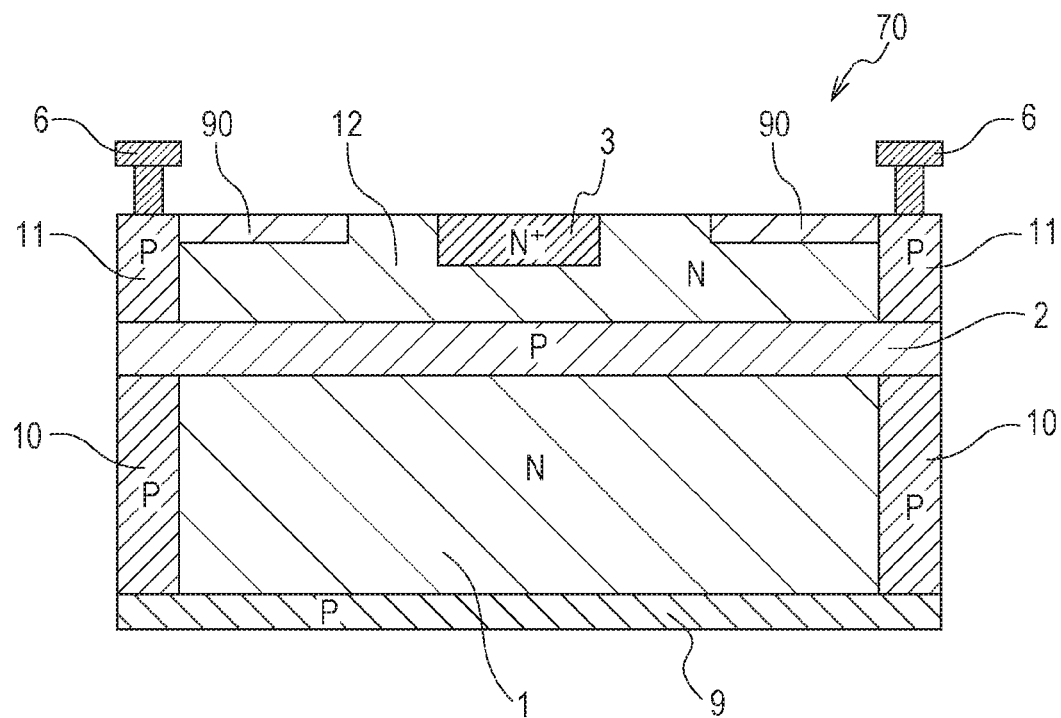
FIG. 10 is a schematic cross sectional view of the photoelectric conversion unit according to a modified example of the first exemplary embodiment.

As illustrated in FIG. 10, the P-type semiconductor region 90 may be arranged on part of the lower surface of the substrate 100. With this configuration, the unwanted charge generated on the lower surface of the substrate 100 is recombined in the P-type semiconductor region 90, and the dark currents themselves generated on the lower surface of the substrate 100 can be reduced.

According to the present exemplary embodiment, the signal charge is transferred by decreasing the potential applied to the P-type semiconductor region 2 and increasing the reverse bias voltage. The configuration is not limited to this, and as described with reference to FIGS. 1A to 1C and FIGS. 2A to 2C, the signal charge may be transferred by increasing the potential in the N-type semiconductor region 3 and increasing the reverse bias voltage. Even in a case where the photoelectric conversion unit 70 described above is used, the effects of the present invention can be attained.

According to the present exemplary embodiment, the P-type semiconductor region 2 is continuously arranged on the lower surface of the N-type semiconductor region 1. That is, the P-type semiconductor region 2 is arranged on the entire surface of the lower surface of the N-type semiconductor region 1. With this configuration, the potential barrier in the P-type semiconductor region 2 is likely to be formed, and the signal charge is likely to be accumulated in the N-type semiconductor region 1. The P-type semiconductor region 2 is set to have an appropriate concentration such that this potential barrier becomes sufficiently low at the time of the signal transfer. The configuration is not limited to this, and a gap may be partially provided in the P-type semiconductor region 2 as long as the potential barrier between the N-type semiconductor region 1 and the N-type semiconductor region 3 is formed. For example, the gap may be provided between a first portion of the second semiconductor region 2 and a second portion of the second semiconductor region 2 in a region overlapped with the N-type semiconductor region 3 in the plane view. An N-type semiconductor region may be arranged in the gap in the P-type semiconductor region 2. This N-type semiconductor region may have an impurity concentration comparable with that of the N-type semiconductor region 1 or that of the N-type semiconductor region 12 or have an impurity concentration different from those impurity concentrations.

The potential Vp does not need to be slowly changed depending on cases during the signal transfer operation period according to the present exemplary embodiment. For example, in a case where only the presence or absence of light incidence is detected or the like, the potential Vp may be abruptly changed from Vp0 to Vp2 even when the plurality of signal charges are accumulated. For this reason, it is sufficient when at least two values are set for the potential Vp.

According to the present exemplary embodiment, the charge multiplication section 50 is set in the non-avalanche state during the signal accumulation operation period. With this configuration, power consumption in a case where intense light is incident can be reduced as compared with the related-art SPAD. That is, since a signal charge generation speed is significantly increased in the SPAD in a case where the intense light is incident, a state is almost established in which the avalanche current continues flowing. The power consumption is increased by this current, and also, a so-called pileup state is established in which the counting of the signal charge is not much performed. Therefore, even when the intense light is incident in the operation according to the exemplary embodiment of the present invention, the time when the state is almost established in which the avalanche current continues flowing is limited to only the signal readout period. Thus, the noise reduction effects and also the power consumption reduction effects are increased as the signal readout period is shorter as compared with the signal accumulation operation period.

On the other hand, it has been described that the inverter circuit 7 and the counter circuit 8 may be set as OFF by setting the charge multiplication section 50 in the avalanche state during the signal accumulation operation period. When the intense light is incident in the above-described operation, the N-type semiconductor region 1 corresponding to the signal charge accumulation section reaches saturation to cause the signal charges to overflow, and the state is almost established in which the avalanche current continues flowing also at the time of the signal accumulation operation. Thus, the power consumption is comparable with the related-art SPAD in this operation. However, the noise reduction effects are attained.

According to the present exemplary embodiment, the inverter circuit 7 is substantially a comparator having a threshold at V3. Therefore, the comparator may be used instead of the inverter circuit 7. In addition, another circuit that performs conversion into a predetermined physical quantity in proportion to the number of counts such as, for example, a charge amount and stores the physical quantity may be used as the counter.

Second Exemplary Embodiment

The light detection apparatus according to a second exemplary embodiment of the present invention is an imaging sensor constituted by disposing a plurality of photoelectric conversion units of the exemplary embodiment of the present invention.

Figure 11:
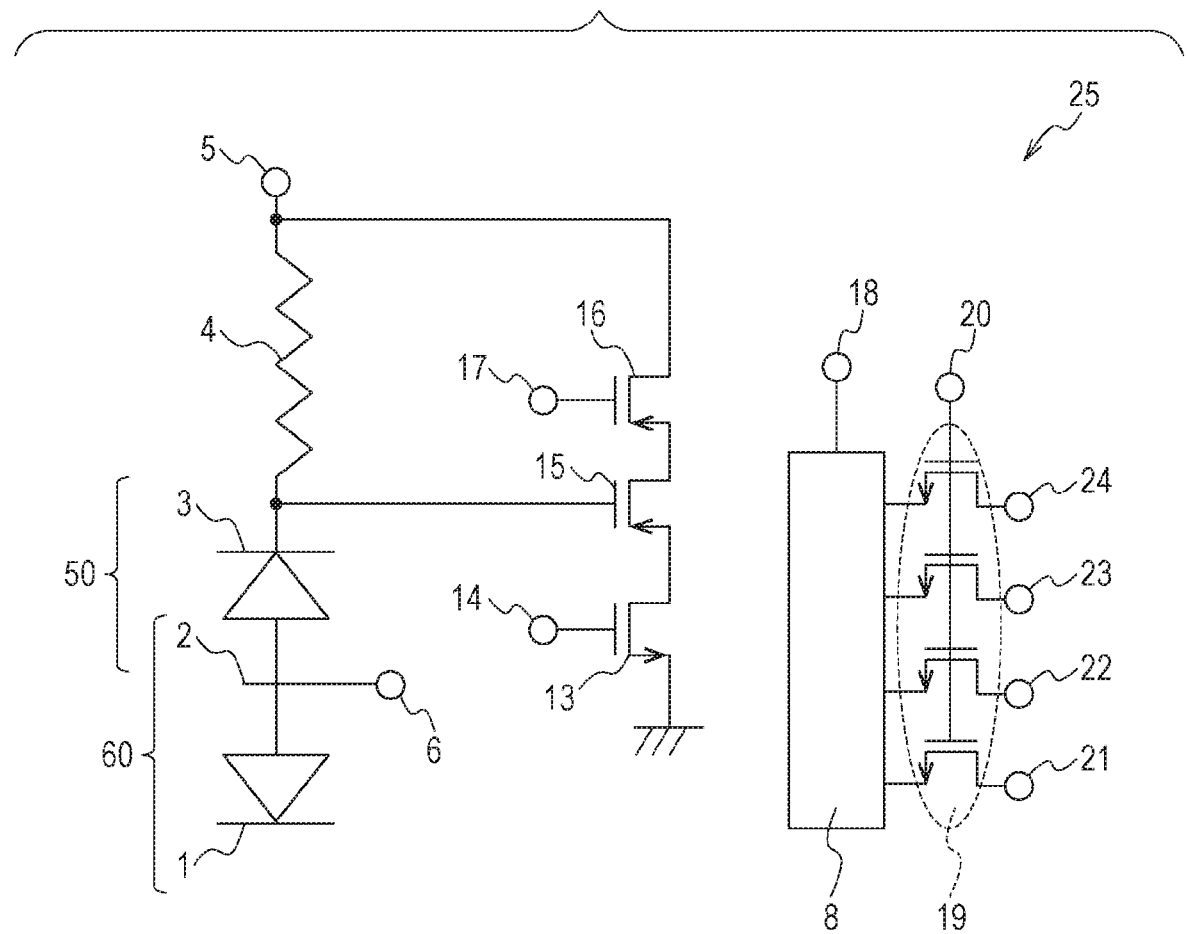
FIG. 11 is an equivalent circuit diagram of part of the light detection apparatus according to a second exemplary embodiment.

FIG. 11 is an equivalent circuit diagram of the light detection apparatus according to the present exemplary embodiment. An operation of the light detection apparatus according to the present exemplary embodiment is basically the same as the first exemplary embodiment, but the circuit part is illustrated in slightly more detail than FIG. 7 to describe respective operation modes as the light detection apparatus. In FIG. 11, the same parts as those in FIG. 7 are assigned with the same reference numerals, and descriptions thereof are omitted.

All the configurations of the photoelectric conversion unit 70 (the photoelectric conversion section 60 and the charge multiplication section 50), the potential control section 6, and the resistance 4 are the same as those of the first exemplary embodiment. For this reason, all the descriptions with regard to those elements according to the first exemplary embodiment will be used for the present exemplary embodiment.

An inverter that can select ON and OFF by a switch is used as the light detection apparatus according to the present exemplary embodiment.

As illustrated in FIG. 11, the light detection apparatus according to the present exemplary embodiment includes a P-type metal-oxide semiconductor (MOS) transistor 15, a P-type MOS transistor 16, and an N-type MOS transistor 13. An input terminal 14 for supplying a predetermined potential and determining a constant current amount is connected to the transistor 13. An input terminal 17 for controlling ON and OFF of the transistor 16 is connected to a gate of the transistor 16.

As illustrated in FIG. 11, a gate of the transistor 15 is connected to the cathode of the charge multiplication section 50. A drain of the transistor 15 is connected to a drain of the transistor 13. A source of the transistor 13 is grounded, and a constant current is supplied to the drain of the transistor 15 via the transistor 13. A source of the transistor 15 is connected to a drain of the transistor 16. A source of the transistor 16 is connected to the potential control section 5 to which the positive power source potential VDD is supplied. Since the transistor 16 operates as a switch, when the transistor 16 is in an ON state, the positive power source potential VDD is supplied to the source of the transistor 15. The potential at the cathode of the charge multiplication section 50 is supplied to the gate of the transistor 15. When a potential at the gate of the transistor 15 exceeds a predetermined threshold, a count pulse is output, and the count pulse is input to the counter circuit 8.

An input terminal 18 controls resetting of the counter circuit 8. The counter circuit 8 may be reset by the input terminal 18 before the signal readout operation period.

MOS transistors for outputting bit information are connected to respective bits of the counter circuit 8. In the present specification, the MOS transistors connected to the respective bits are collectively referred to as a MOS transistor group 19.

An input terminal 20 is connected to gates of the MOS transistor group 19 for switching and controls ON and OFF of the MOS transistor group 19. The pieces of bit information of the counter circuit 8 from the respective MOS transistors of the MOS transistor group 19 are output from output terminals 21, 22, 23, and 24 at the same time.

For the sake of convenience for the descriptions, in FIG. 11, the bit count of the counter circuit 8 is set as 4, and the number of switches of the MOS transistor group 19 is set as 4, but the actual bit count may be set as a much higher number. On the other hand, one switch may be used, and the respective bit information of the counter circuit 8 may be output in series.

Figure 12:
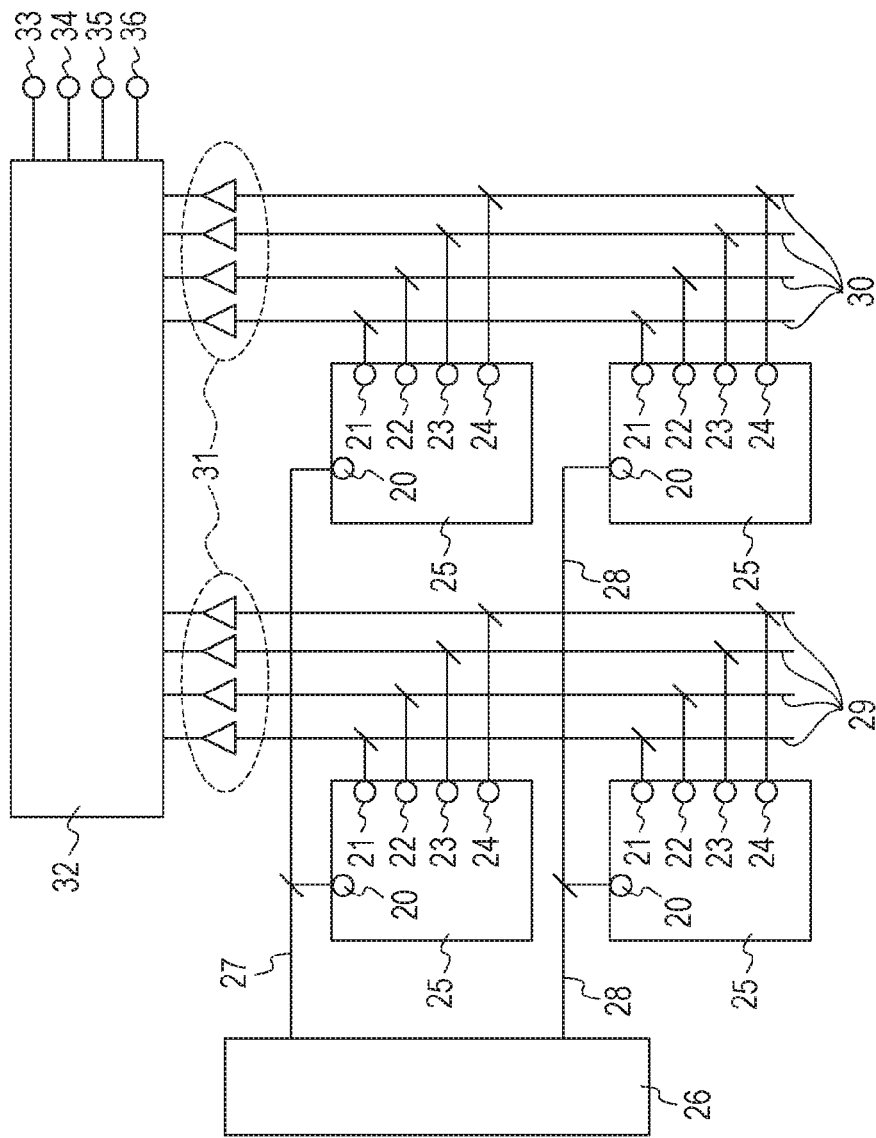
FIG. 12 is an overall view of the light detection apparatus according to the second exemplary embodiment.

FIG. 12 is an overall view of the light detection apparatus. For the sake of convenience for the descriptions, the light detection elements 25 are disposed in two rows and two columns Each of the light detection elements 25 includes a circuit illustrated in FIG. 11. It should be noted that the light detection element 25 is equivalent to a pixel in the imaging sensor.

The light detection apparatus includes a vertical scanning circuit 26 configured to sequentially select rows. The light detection apparatus also includes a first row selecting line 27 that is output from the vertical scanning circuit 26 to be connected to the input terminals 20 of the light detection elements 25 disposed in the first row and a second row selecting line 28 that is output from the vertical scanning circuit 26 to be connected to the input terminals 20 of the light detection elements 25 disposed in the second row. The light detection apparatus also includes four vertical output lines 29 which are respectively connected to the output terminals 21, 22, 23, and 24 of the light detection elements 25 in the first column and from which the respective pieces of bit information of the counter circuits 8 of the respective pixels in the first column are output. The light detection apparatus also includes four vertical output lines 30 which are respectively connected to the output terminals 21, 22, 23, and 24 of the pixels in the second column and from which the respective pieces of bit information of the counter circuits 8 of the respective pixels in the second column are output. The light detection apparatus also includes preamplifiers 31 connected to the respective vertical output lines. The light detection apparatus also includes a horizontal scanning circuit 32 configured to sequentially select respective columns where outputs of the four preamplifiers in the respective columns are output at the same time. The preamplifier outputs in the respective columns are sequentially output from output terminals 33, 34, 35, and 36 in accordance with the horizontal scanning circuit 32.

Although those are not directly illustrated in FIG. 12, the potential control sections 5, the potential control sections 6, the input terminals 14, the input terminals 17, and the input terminals 18 included in the respective light detection elements 25 are respectively connected commonly in all the light detection elements.

Figure 13:
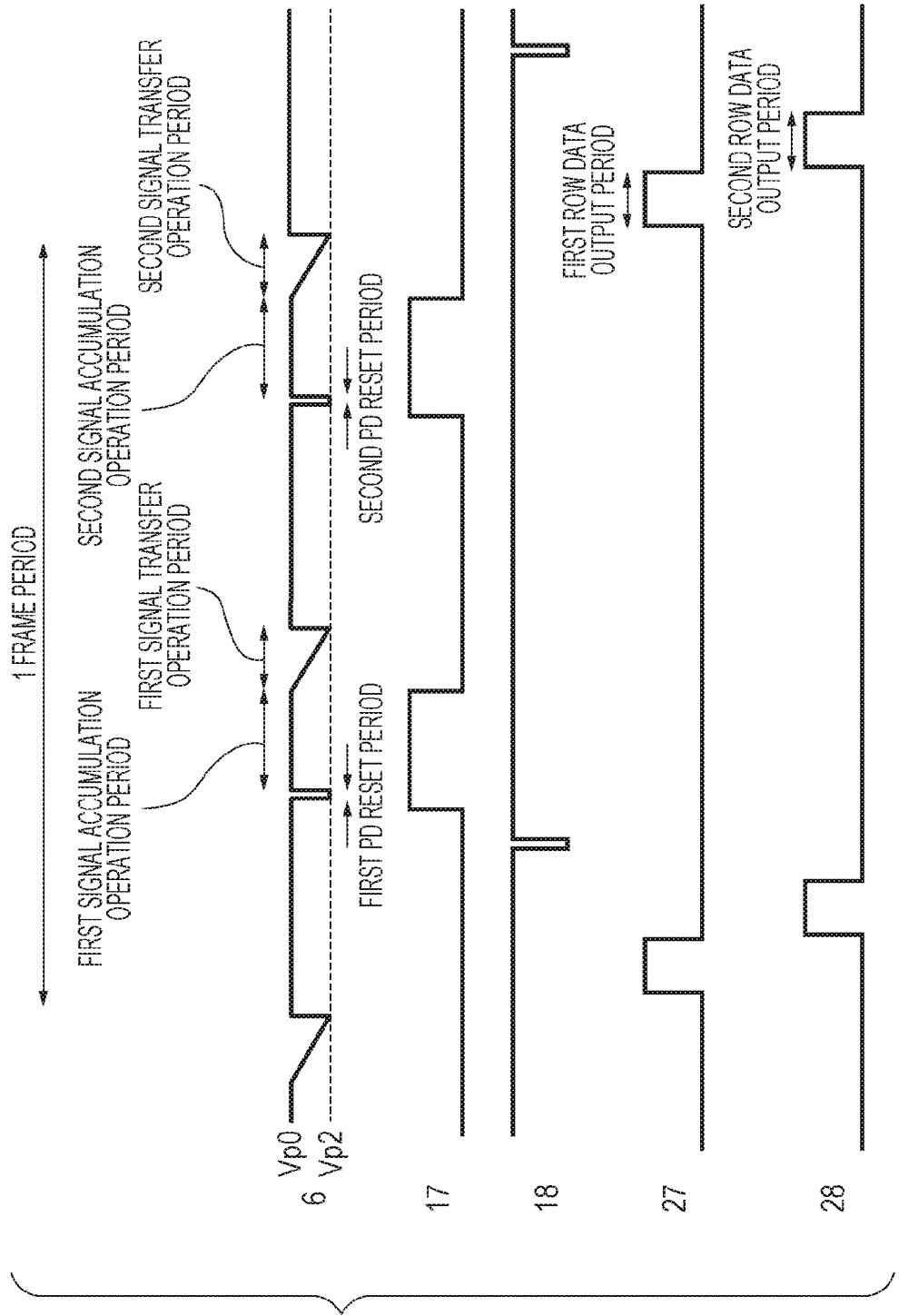
FIG. 13 is a timing chart for describing an operation of the light detection apparatus according to the second exemplary embodiment.

FIG. 13 is a timing chart for describing an operation mode including a global electronic shutter function. The horizontal axis is a temporal axis. FIG. 13 illustrates a change of the potential of the potential control section 6. FIG. 13 also illustrates a state in which the input terminal 17, the input terminal 18, the first row selecting line 27, and the second row selecting line 28 are controlled to be High or Low.

When the input terminal 17 is at a Low level, the inverter that detects the avalanche current when the P-type MOS transistor 16 becomes conductive is set in an operative state. In contrast to this, when the input terminal 17 is at a High level, the inverter is set in a non-operative state.

When the input terminal 18 is at the High level, the counter circuit 8 is set in the operative state. When the input terminal 18 is at the Low level, all the bits of the counter circuit 8 are reset to establish a state in which the count value of the counter circuit 8 is zero.

FIG. 13 illustrates 1 frame period corresponding to a period in which signals for constituting a single frame are generated in the respective light detection elements 25 to perform signal output. According to the present exemplary embodiment, the signal generation includes the accumulation of the signal charge by the photoelectric conversion section 60, the transfer of the signal charge from the photoelectric conversion section 60 to the charge multiplication section 50, the multiplication of the signal charge by the charge multiplication section 50, the counting operation by the counter circuit 8, and the like.

According to the present exemplary embodiment, the signal accumulation operation periods in the plurality of light detection elements 25 that perform the signal output during mutually different periods are matched with each other. A so-called global electronic shutter operation is performed.

As illustrated in FIG. 13, in a period in which the signals for the n-th frame are generated, that is, a frame period for the n-th frame, the signals for the (n−1)-th frame corresponding to the previous frame are output. As the signal output operation, the count value based on the accumulated signal charges is output from the counter circuit 8 to the vertical output line. At this time, the count values are sequentially output row by row. Specifically, while the first row selecting line 27 is at High, the count value of the counter circuit 8 of the light detection element 25 in the first row in the first column is output to the vertical output line 29. In addition, during the same period, the count value of the counter circuit 8 of the light detection element 25 in the first row in the second column is output to the vertical output line 30. Those count values are output by the horizontal scanning circuit 32 from the output terminals 33, 34, 35, and 36 in the stated order of the first column and the second column. Similarly, while the second row selecting line 28 is High, the count values of the counter circuits 8 of the light detection elements 25 in the second row are output from the output terminals 33, 34, 35, and 36.

After the data output in this previous frame is ended, the input terminal 18 turns to the Low level, and all the counter circuits 8 are reset. The resetting of the counter circuits 8 may be performed before the signal readout operation in the next frame (the n-th frame) is started.

According to the present exemplary embodiment, as illustrated in FIG. 13, the 1 frame period includes a plurality of signal accumulation operation periods and a plurality of signal transfer operation periods. The signal accumulation operation period and the signal transfer operation period are respectively similar to those described according to the first exemplary embodiment. Although not illustrated in the drawing, at least part of the signal transfer operation period is the signal readout operation period.

According to the present exemplary embodiment, after one signal transfer operation period is ended, a predetermined interval elapses, and the next signal accumulation operation period is then started. That is, the 1 frame period may also include a period that is not contributed to the signal generation. When the period that is not contributed to the signal generation is included, while sampling of a subject is performed over a long period of time, an exposure period (shutter speed) can be shortened. Therefore, even when an excessively bright subject is captured, an appropriate signal amount is obtained, and an image hardly having overexposed highlights can be obtained.

The signal accumulation operation and the signal transfer operation will be specifically described. When the input terminal 17 is at the High level, that is, when the inverter is in the OFF state, the potential of the potential control section 6 becomes Vp2, and the charges accumulated in the cathodes of the photoelectric conversion sections 60 in all the pixels are discharged to the cathodes of the charge multiplication sections 50. During this period, even when the avalanche multiplication is caused by the charges transferred to the charge multiplication sections 50, counting is not performed. With this configuration, resetting of the signal charges is performed in the photoelectric conversion sections 60 of all the pixels, and thereafter, the first signal accumulation operation is started.

Next, the input terminal 17 is set at the Low level, and the potential of the potential control section 6 is gradually changed from Vp0 to Vp2 to perform the first signal transfer operation. After a predetermined time has then elapsed, resetting of the second signal charge, the second signal accumulation operation, and the second signal transfer operation are performed similarly as in the first respective operations.

The 1 frame period thus ends here, and the output of the count values of the counter circuits in all the pixels during this frame period is performed at the beginning of the next frame period.

The plurality of signal transfer operations are performed, but the counter circuit 8 is not reset during the operations. Therefore, the signals obtained in the plurality of signal transfer operations are added to each other in the counter circuit. That is, the signals held in the counter circuits 8 of the respective light detection elements 25 are additional signals for the first and second operations and signals for constituting one image (frame).

The resetting of the signal charges is performed twice during the 1 frame in the operation illustrated in FIG. 13, and an effective light reception period in which the effective counting is performed as the signal corresponds to the first and second signal accumulation operation periods and the first and second signal transfer operation periods.

When the photoelectric conversion section 60 is reset in the midcourse of the 1 frame period, a so-called electronic shutter operation is exercised in which the effective light reception period is set to be shorter than the 1 frame period. In this case too, since the signal accumulation operation periods of all the photoelectric conversion sections 60 are matched with each other, the global electronic shutter is realized.

In FIG. 13, the signal accumulation operations and the plurality of signal readout operations corresponding to the signal accumulation operations are performed twice, but the above-described operations may be performed once or may also be performed three times or more.

According to the present exemplary embodiment, the plurality of signal accumulation operations and the plurality of signal transfer operations corresponding to the signal accumulation operations are performed. With this configuration, the saturated signal charges of the light detection element 25 can be set to be large. The saturated signals in the single signal accumulation and signal transfer operation are determined by a saturated charge amount of the photoelectric conversion section 60 (maximum charge amount that can be accumulated). When the signal accumulation and the signal transfer operation are repeatedly performed plural times to add the counts in the counter circuit 8, the signal charge exceeding the saturated charge amount of the photoelectric conversion section 60 can be counted as one frame signal.

The effective light reception period is distributed while a certain gap period is inserted therebetween during the 1 frame period. When the number of distributions of the signal accumulation operation is increased, the probability that a signal at the time of light emission is missed is reduced in a case where a subject that flashes in a certain cycle is captured, and a natural image can be obtained. In a case where an incident light intensity is weak, the resetting operation of the signal charges of the photoelectric conversion section 60 may also be avoided. In this case, all the periods of the 1 frame becomes the effective light reception period.

The above-described global electronic shutter function according to the second exemplary embodiment will be compared with the related-art sensor.

The CCD has the electronic shutter function, but an issue of a pseudo signal from another pixel occurs during the signal transfer operation period. The CMOS sensor originally has an issue that the signal accumulation timings in the respective rows are shifted from each other little by little, and the electronic shutter function itself is difficult. The CMOS sensor that includes a memory in the pixel and has the electronic shutter function has also been developed, but the issue of the pseudo signal still occurs.

In this regard, a digital memory is used, and also switching control of the avalanche multiplication can be performed in the imaging sensor according to the second exemplary embodiment. Thus, the nearly complete global electronic shutter involving no pseudo signal can be realized. That is, after necessary signal information is stored in the digital memory, the probability that the unwanted pseudo signal is involved can be nearly completely eliminated.

The global electronic shutter involving no pseudo signal can also be realized by a sensor constituted by two-dimensionally disposing the related-art SPADs, but the signal detection operation needs to be paused or the counting operation needs to be paused during the data output period for the digital memory of the pixel. This is because, in general, the data output of the memory is performed at a different timing for each row as described according to the second exemplary embodiment. Since the signal is counted by the incident light also during the data output period of the digital memory in the related-art SPAD that includes no signal accumulation section, when the signal detection and the counting operation are also performed during the data output period of the memory, the signal accumulation timing is shifted for each row. When the 1 frame is 10 ms, and the data output is 3 ms, the signal detection period needs to be set as 7 ms at the longest.

Therefore, according to the second exemplary embodiment, the accumulation of the signal charge and the output of the count value obtained by being read out by the counter circuit 8 in the previous frame can be performed in parallel in the 1 frame. Therefore, the frame time is not wasted. When the 1 frame is 10 ms, the effective light reception period for the signal can also be set as 10 ms at the longest.

As described above, according to the second exemplary embodiment, it is possible to realize the imaging sensor having the complete electronic shutter function in which the high signal-to-noise ratio is obtained and also the loss of the frame time does not occur.

Third Exemplary Embodiment

Figure 14:
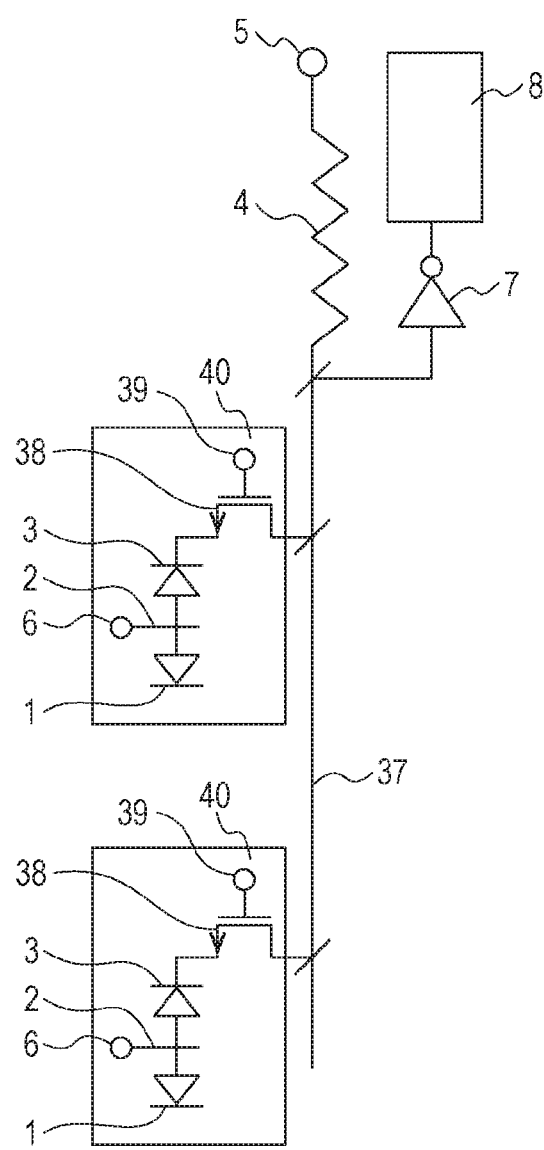
FIG. 14 is an equivalent circuit diagram of the light detection apparatus according to a third exemplary embodiment.

FIG. 14 is an equivalent circuit diagram illustrating the light detection apparatus according to a third exemplary embodiment of the present invention. In FIG. 14, the same parts as those in FIG. 7 are assigned with the same reference numerals, and redundant descriptions are omitted.

As illustrated in FIG. 14, the plurality of photoelectric conversion units 40 are connected to a common vertical output line 37 in the light detection apparatus according to the present exemplary embodiment. An N-type MOS transistor 38 is connected between a cathode of the charge multiplication section and the vertical output line 37 and controls the transfer of the signal charges. An input terminal 39 applies a control pulse to a gate of the N-type MOS transistor 38. In FIG. 14, two photoelectric conversion units 40 are connected to the vertical output line 37, but three or more photoelectric conversion units 40 may be connected to the common vertical output line. According to the present exemplary embodiment, the vertical output line to which the plurality of photoelectric conversion units 40 are connected is connected to the resistance 4 and the inverter circuit 7.

The signal readout operation is performed in the photoelectric conversion unit 40 where a High pulse is applied to the input terminal 39 among the plurality of photoelectric conversion units 40 connected to the vertical output line 37. The signal readout operation is not performed in the photoelectric conversion unit 40 where a pulse applied to the input terminal 39 is Low among the plurality of photoelectric conversion units 40 connected to the vertical output line 37.

When the High pulse is applied to the input terminal 39, the resistance 4 and the cathode of the charge multiplication section become electrically conductive through the N-type MOS transistor 38. Therefore, when the potential of the potential control section 6 is gradually changed from Vp0 to Vp2, the signal transfer operation as described according to the first exemplary embodiment is performed. After the signal transfer operation is ended, the signal accumulation operation is started.

On the other hand, when the input terminal 39 remains at Low, since the potential from the potential control section 5 to the cathode of the charge multiplication section 50 is not supplied, the height of the potential barrier is not changed even when the potential of the potential control section 6 becomes Vp2. Therefore, the accumulated signal charges remain in the cathode of the photoelectric conversion section 60 without being transferred to the charge multiplication section 50.

When the plurality of photoelectric conversion units 40 connected to the vertical output line 37 are sequentially selected to perform the signal readout operations, the operations of the respective photoelectric conversion units 40 can be performed. To select one photoelectric conversion unit 40, the High pulse is applied to the input terminal 39 of the single photoelectric conversion unit 40, and the input terminals 39 of the other photoelectric conversion units 40 are kept at the Low level.

To constitute the light detection apparatus according to the present exemplary embodiment as the imaging sensor, for example, while circuit systems illustrated in FIG. 14 are set as a group unit (one column), a plurality of same circuit systems are disposed. A direction in which the plurality of circuit systems are disposed is a direction (row) intersecting with the direction in which the two photoelectric conversion units 40 are disposed in FIG. 14. With this configuration, the photoelectric conversion units 40 are two-dimensionally disposed. When the photoelectric conversion units 40 are sequentially selected in units of row to perform the signal readout operations, the light detection apparatus can operate as the imaging sensor. It should be noted that, as a configuration in which the plurality of circuit systems of FIG. 14 are disposed in one column, that is, a configuration including a plurality of count circuits corresponding to the number of plural vertical output lines 37 per column of the two-dimensionally disposed photoelectric conversion units, an imaging sensor configuration in which readout can be performed in a plurality of rows at the same time may also be adopted.

In the above-described operation of the two-dimensional imaging sensor, the signal accumulation times for the respective rows can be set to be the same, but start timings for the signal accumulation operations are shifted little by little for the respective readout selection rows. This corresponds to a so-called rolling shutter operation. In this case, concurrency of imaging timings is lost as compared with the global electronic shutter operation. Thus, in accordance with the light detection apparatus according to the present exemplary embodiment, the plurality of photoelectric conversion units 40 commonly use the resistance 4, the potential control section 5, the inverter circuit 7, and the counter circuit 8. Therefore, it becomes easier to form the resistance 4, the potential control section 5, the inverter circuit 7, and the counter circuit 8 on the same semiconductor substrate as the photoelectric conversion unit 40 without forming those on the semiconductor substrate separate from the photoelectric conversion unit 40 as in the first exemplary embodiment. Thus, an advantage is attained that costs for manufacturing the sensor are suppressed to be lower than that of the first and second exemplary embodiments.

It should be noted that a configuration may also be adopted in which the resistances 4, the potential control sections 5, and the inverter circuits 7 are respectively arranged with respect to the respective photoelectric conversion units, and outputs are performed from the selected respective inverter circuits 7 to the vertical output line, and only the counter circuit 8 is commonly used.

As described above, in accordance with the light detection apparatus according to the third exemplary embodiment of the present invention, since the plurality of photoelectric conversion units 40 can commonly use the counter circuit 8 that a requires a substantial scale, it becomes possible to avoid the higher costs of the light detection apparatus.

It should be noted that various exemplary embodiments are conceivable other than the above-described exemplary embodiments. For example, the modes applied to the imaging apparatus have been mainly described according to the above-described exemplary embodiments. The configuration is not limited to this, and as in an autofocus sensor of a camera, an operation is also conceivable where the signal charge accumulation amount of the photoelectric conversion unit is monitored in the course of the signal accumulation operation, and the photoelectric conversion unit is reset when the signal charge accumulation amount reaches a predetermined level. Characteristics of signal nondestructive readout of the sensor according to the exemplary embodiment of the present invention are applied to this configuration.

A related-art SPAD operation mode and an operation mode according to the exemplary embodiment of the present invention can also be switched. The related-art SPAD operation mode is basically an operation mode in which the signal accumulation operation is not performed, and the potential of the potential control section 6 is fixed at Vp2, readout and counting of the signal charge are regularly performed by the charge multiplication. In a case where the exemplary embodiment of the present invention is applied to the imaging sensor as in the second exemplary embodiment, for example, in a case where the unwanted charges are few because the 1 frame period is short, the related-art SPAD operation is performed, and in a case where the 1 frame period is long, the operation mode according to the exemplary embodiment of the present invention can be selected.

In addition, according to the present exemplary embodiment, the accumulation operation periods are matched to each other in all the light detection elements. The configuration is not limited to this, and the signal accumulation operation period in one light detection element 25 may be included in the signal accumulation operation period in the other light detection element 25. This is applied, for example, to a case where a length of the accumulation operation period varies for each row in high dynamic range (HDR) drive or the like.

Fourth Exemplary Embodiment

Figure 15:
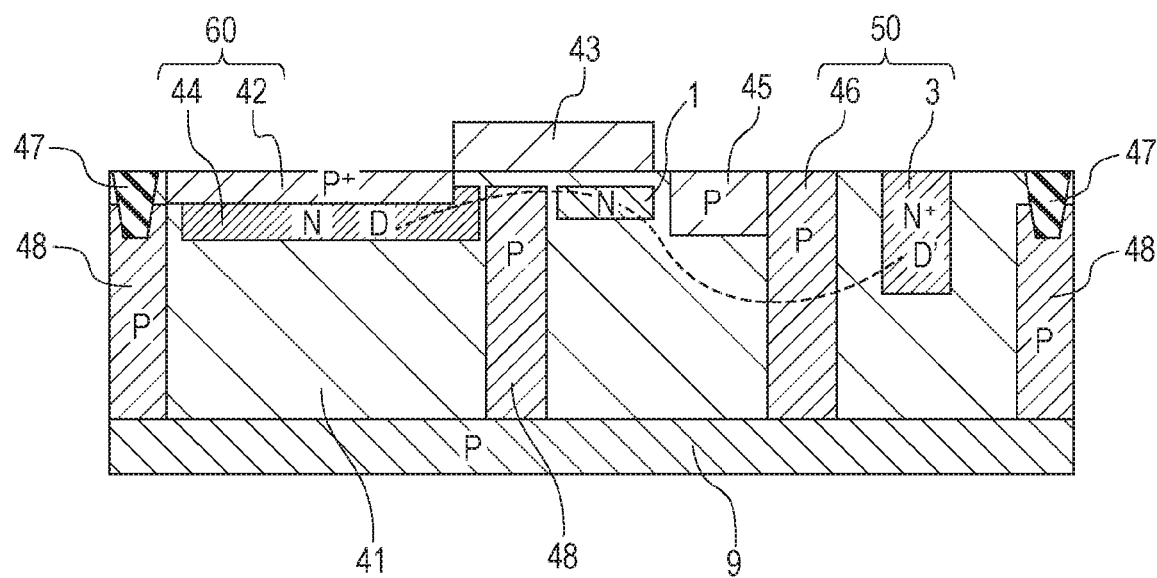
FIG. 15 is a schematic cross sectional view of the photoelectric conversion unit according to a fourth exemplary embodiment.

FIG. 15 is a schematic cross sectional view of the photoelectric conversion unit of the light detection apparatus according to a fourth exemplary embodiment of the present invention. In FIG. 15, the same parts as those in FIGS. 1A to 1C and FIGS. 3A to 3C are assigned with the same reference numerals, and redundant descriptions are omitted. Since the resistance 4, the potential control section 5, the inverter circuit 7, and the counter circuit 8 are the same as those of the exemplary embodiments described thus far, the descriptions thereof are omitted. The light detection apparatus according to the present exemplary embodiment is different from the first exemplary embodiment in that the height of the potential barrier is controlled by a gate electrode 43.

As illustrated in FIG. 15, according to the present exemplary embodiment, the photoelectric conversion section 60 constituted by the P-type semiconductor region 42, the N-type semiconductor region 44, and the N-type semiconductor region 41 which will be described below and the charge multiplication section 50 constituted by the P-type semiconductor region 46 and the N-type semiconductor region 3 are arranged next to each other in a direction parallel to the upper surface of the semiconductor substrate. The N-type semiconductor region 1 is arranged between the photoelectric conversion section 60 and the charge multiplication section 50. The P-type semiconductor region 48 (sixth semiconductor region) is arranged between the N-type semiconductor region 44 of the photoelectric conversion section 60 and the N-type semiconductor region 1. The gate electrode 43 is arranged in a region overlapped with the P-type semiconductor region 48 and the N-type semiconductor region 1 in the plane view.

The signal charges accumulated in the N-type semiconductor region 44 are transferred to the N-type semiconductor region 1 by controlling the potential supplied to the gate electrode 43. The height of the potential barrier between the N-type semiconductor region 1 and the N-type semiconductor region 3 is also controlled by controlling the potential supplied to the gate electrode 43. When the predetermined potential such as the ground potential is supplied to the P-type semiconductor region 46 arranged between those, the potential barrier between the N-type semiconductor region 1 and the N-type semiconductor region 3 is formed.

The P-type semiconductor region 42 having a higher impurity concentration than the impurity concentration in the P-type semiconductor region 48 is arranged in the semiconductor interface section corresponding to an upper section of the N-type semiconductor region 44. The P-type semiconductor region 42 and the N-type semiconductor region 44 constitute the PD of the buried type.

The N-type semiconductor region 41 having a lower impurity concentration than the N-type semiconductor region 44 is arranged on a lower surface of the N-type semiconductor region 44. It should be noted that the N-type semiconductor region 41 may be a P-type semiconductor region having a lower impurity concentration than the P-type semiconductor region 9. A location where the signal charge generated by the incident light is mainly the N-type semiconductor region 41 (fifth semiconductor region).

The P-type semiconductor region 45 (eighth semiconductor region) is arranged in a region that is not overlapped with the gate electrode 43 between the N-type semiconductor region 1 and the P-type semiconductor region 46 in the plane view and also that constitutes part of the upper surface of the semiconductor substrate. As described above, the unwanted charge is likely to be generated on the surface of the semiconductor substrate. When the P-type semiconductor regions 42 and 45 are arranged in a region constituting a part of the upper surface of the semiconductor substrate, and also the impurity concentrations thereof are high concentrations, depletion in the semiconductor interface section is impeded, the generation speed of the unwanted charge, that is, the generation speed of the dark current can be significantly decreased.

The P-type semiconductor region 46 is arranged between the N-type semiconductor region 1 and the N-type semiconductor region 3. The potential barrier by the P-type semiconductor region 46 is formed between the N-type semiconductor region 1 and the N-type semiconductor region 3. A predetermined potential such as a ground potential is supplied to the P-type semiconductor regions 46, 9, 42, and 48.

An element separator 47 constituted by an insulator is arranged in the surrounding of the photoelectric conversion unit including the photoelectric conversion section 60 and the charge multiplication section 50 in the plane view. The P-type semiconductor region 48 for separating the respective photoelectric conversion units is arranged below the element separator 47.

Figure 16:
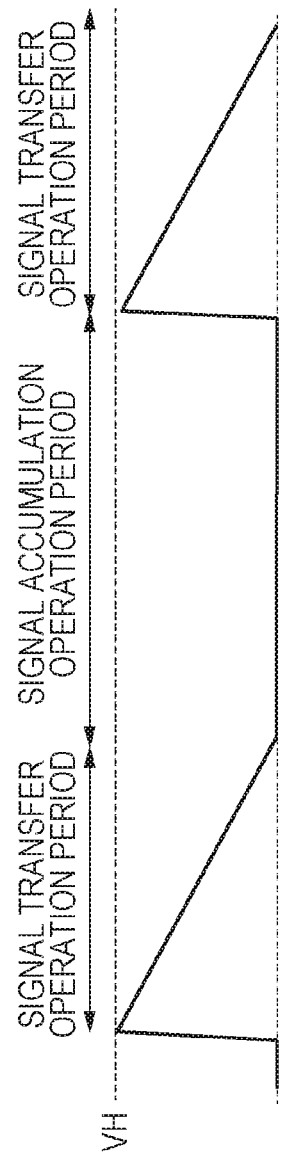
FIG. 16 is a timing chart for describing an operation of the photoelectric conversion unit according to the fourth exemplary embodiment.
Figure 17A:
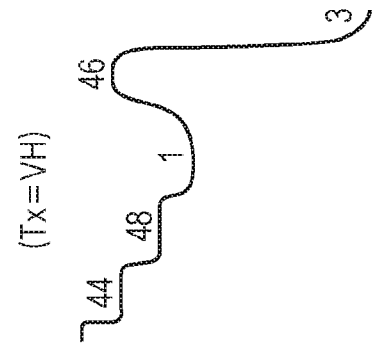
FIGS. 17A to 17C illustrate potentials of the photoelectric conversion unit according to the fourth exemplary embodiment.
Figure 17B:
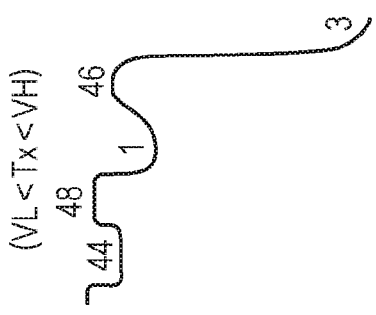
Figure 17C:
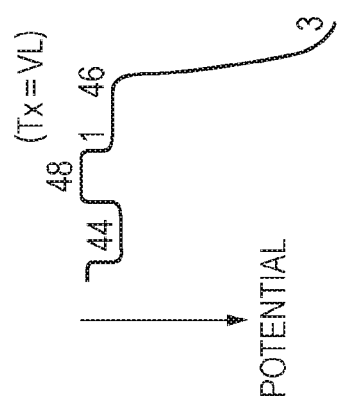

FIG. 16 illustrates an operation based on a change of the potential supplied to the gate electrode 43 according to the present exemplary embodiment. FIG. 16 illustrates a situation where, when the potential of the gate electrode 43 is set as Vtx, the signal transfer operation and the signal accumulation operation are controlled by changing the potential Vtx. FIGS. 17A to 17C illustrate changes of a potential along a broken line D-D' in FIG. 15 which is caused by the change of the potential of the gate electrode 43 during the signal transfer operation period. The change of the height of the potential barrier which is caused by the change of Vtx will be described with reference to FIG. 16 and FIGS. 17A to 17C.

First, the potential Vtx is controlled to a first potential VL. The generated signal charge is accumulated in the N-type semiconductor region 44 while the potential Vtx applied to the gate electrode 43 is the first potential VL. That is, a period in which the potential Vtx applied to the gate electrode 43 is the first potential VL corresponds to the signal accumulation operation period.

The potential at this time is illustrated in FIG. 17A. The first potential VL is set so as to form the potential barrier between the N-type semiconductor region 44 and the N-type semiconductor region 1. Since the gate electrode 43, the P-type semiconductor region 48, and an insulating film that is not illustrated in the drawing between them constitute the MOS structure, the potential in the P-type semiconductor region 48 below the gate electrode 43 may be controlled by the potential of the gate electrode 43.

As illustrated in FIG. 16, to start the signal transfer operation, the potential Vtx applied to the gate electrode 43 changes from the first potential VL to a second potential VH. Thereafter, the potential Vtx gradually changes from the second potential VH to the first potential VL. Since the signal charge is an electron, the second potential VH is a potential higher than the first potential VL.

FIG. 17C illustrates a potential when the potential Vtx is the second potential VH. The potential in the P-type semiconductor region 48 (and the N-type semiconductor region 1) is decreased as compared with a time when the potential Vtx is the first potential VL. For this reason, the potential barrier formed between the N-type semiconductor region 44 and the N-type semiconductor region 1 disappears. As a result, the signal charge accumulated in the N-type semiconductor region 44 is transferred to the N-type semiconductor region 1. It should be noted that the potential in the P-type semiconductor region 46 hardly receives influences of the potential of the gate electrode 43. For this reason, as a result of the relative decrease in the potential in the N-type semiconductor region 1, the potential barrier is formed between the N-type semiconductor region 1 and the N-type semiconductor region 3. Therefore, the signal charge transferred to the N-type semiconductor region 1 is held in the N-type semiconductor region 1.

When the potential Vtx applied to the gate electrode 43 is decreased from the second potential VH towards the first potential VL, as illustrated in FIG. 17B, the potential of the N-type semiconductor region 1 and the potential of the P-type semiconductor region 48 are increased. Accordingly, the potential barrier by the P-type semiconductor region 46 is lowered. Therefore, the signal charge is transferred from the N-type semiconductor region 1 to the N-type semiconductor region 3. According to the present exemplary embodiment, the potential Vtx gradually changes from the second potential VH to the first potential VL. In accordance with the above-described configuration, similarly as in the first exemplary embodiment, the signal charge held in the N-type semiconductor region 1 can be transferred one by one.

Similarly as in the P-type semiconductor region 2 and the N-type semiconductor region 3 described according to the first exemplary embodiment, a reverse bias sufficient enough to generate the avalanche multiplication is applied between the P-type semiconductor region 46 and the N-type semiconductor region 3. Therefore, when the signal charge is transferred to the N-type semiconductor region 3, the avalanche multiplication is generated by the same operation as the first exemplary embodiment, and the signal charge is counted.

As described above, the N-type semiconductor region 1 where the signal charge is accumulated does not need to be provided with the photoelectric conversion function. In the above-described case too, similarly as in the first exemplary embodiment, the probability that the unwanted charge is counted can be reduced.

Since the operation is controlled by the potential of the gate electrode 43 according to the fourth exemplary embodiment, the drive is more easily controlled than the first exemplary embodiment.

Similarly as in the first exemplary embodiment, the charge multiplication section 50 may be set in the avalanche state only during the readout operation period by controlling the voltage applied to the N-type semiconductor region 3, for example. As an alternative to the above-described configuration, since an electrode potential other than the gate electrode 43 is fixed as much as possible, the inverter circuit 7 and the counter circuit 8 may be set in a pause state during a period other than the readout operation while the charge multiplication section 50 is normally kept in the avalanche state.

In the case of the former configuration, the reduction effects of the unwanted charge, that is, the reduction effects of the noise are attained, and the power reduction effects upon the intense light incidence are also attained. In the case of the latter configuration, the noise reduction effects are attained.

According to the present exemplary embodiment, since the photoelectric conversion section 60 and the charge multiplication section 50 are not laminated in a vertical direction in the light detection apparatus unlike the first exemplary embodiment, a surface on a side where the gate electrode 43 is arranged may be set as the light incidence surface, or a surface on a side opposite to the side where the gate electrode is arranged 43 may also be set as the light incidence surface with regard to the light incidence.

As described above, according to the fourth exemplary embodiment of the present invention, it is possible to realize the light detection apparatus in which the drive is more facilitated and which has the high signal-to-noise ratio and also the excellent transfer performance.

Fifth Exemplary Embodiment

Figure 18:
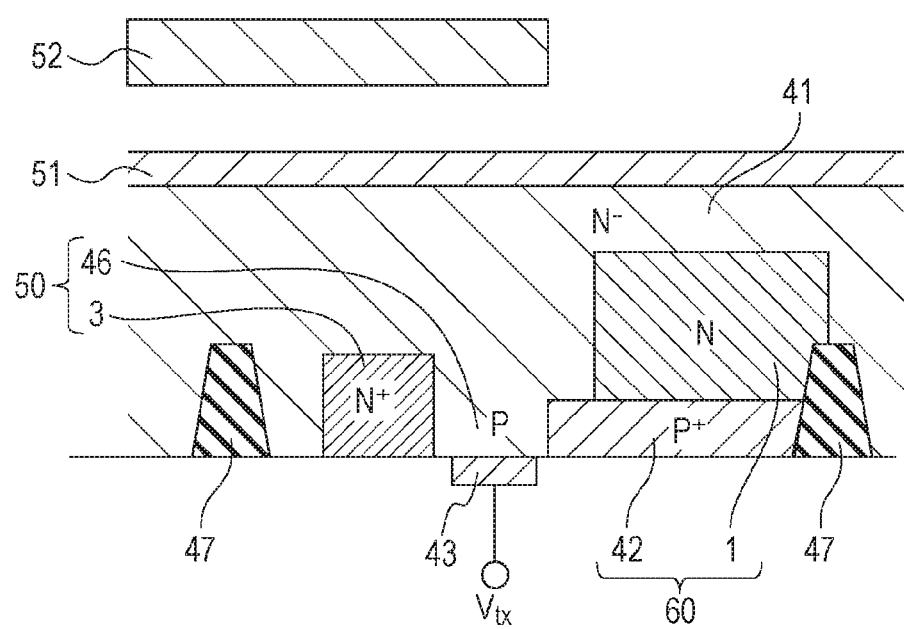
FIG. 18 is a schematic cross sectional view of the photoelectric conversion unit according to a fifth exemplary embodiment.

FIG. 18 is a schematic cross sectional view of the photoelectric conversion unit of the light detection apparatus according to a fifth exemplary embodiment of the present invention. In FIG. 18, the same parts as those in FIGS. 17A to 17C are assigned with the same reference numerals, and redundant descriptions are omitted. Since the resistance 4, the potential control section 5, the inverter circuit 7, and the counter circuit 8 are the same as those of the exemplary embodiments described thus far, the descriptions thereof are omitted. The light detection apparatus according to the present exemplary embodiment is different from the fourth exemplary embodiment in that the N-type semiconductor region 44 is not arranged, and the signal charge is directly transferred from the N-type semiconductor region 1 to the N-type semiconductor region 3. In the light detection apparatus according to the present exemplary embodiment, light may be incident from the side where the gate electrode 43 is arranged, and light may be incident from the opposite side. FIG. 18 illustrates a structure in a case where light is incident from the side opposite to the side where the gate electrode 43 is arranged.

As illustrated in FIG. 18, according to the present exemplary embodiment, the photoelectric conversion section 60 and the charge multiplication section 50 are arranged in a direction in parallel to the lower surface of the semiconductor substrate.

The P-type semiconductor region 46 is arranged between the N-type semiconductor region 1 of the photoelectric conversion section 60 and the N-type semiconductor region 3 of the charge multiplication section 50. The gate electrode 43 is arranged so as to be overlapped with the P-type semiconductor region 46 in the plane view. The height of the potential barrier in the vicinity of the semiconductor interface immediately below the gate electrode 43 between the N-type semiconductor region 1 and the N-type semiconductor region 3 is controlled by controlling the potential supplied to the gate electrode 43.

First, in a case where the potential Vtx applied to the gate electrode 43 is the first potential VL, the potential barrier between the N-type semiconductor region 1 and the N-type semiconductor region 3 is formed. In other words, the first potential VL is set so as to form the potential barrier between the N-type semiconductor region 1 and the N-type semiconductor region 3. The period in which the potential Vtx is the first potential VL is the signal accumulation operation period.

To start the signal transfer operation, the potential Vtx applied to the gate electrode changes from the first potential VL to the second potential VH. With this configuration, the potential in the vicinity of the semiconductor interface section of the P-type semiconductor region 46 is decreased. For this reason, the potential barrier formed between the N-type semiconductor region 1 and the N-type semiconductor region 3 disappears. As a result, in a case where the potential Vtx applied to the gate electrode 43 is the second potential VH, the signal charges accumulated in the N-type semiconductor region 1 are transferred to the N-type semiconductor region 3.

According to the present exemplary embodiment, the potential Vtx gradually changes from the first potential VL to the second potential VH. In accordance with the above-described configuration, similarly as in the first exemplary embodiment, the signal charge held in the N-type semiconductor region 1 can be transferred one by one.

Similarly as in the P-type semiconductor region 2 and the N-type semiconductor region 3 described according to the first exemplary embodiment, the reverse bias sufficient enough to generate the avalanche multiplication is applied between the P-type semiconductor region 46 and the N-type semiconductor region 3 during the signal transfer operation period. Therefore, in the course of the transfer of the signal charge to the N-type semiconductor region 3, the number of generation times of the avalanche multiplication is counted by the same operation as the first exemplary embodiment. Then, the potential applied to the N-type semiconductor region 3 is set such that the avalanche multiplication is not generated during the accumulation operation period. It should be noted that, during the signal accumulation operation, the operation of the inverter circuit or the counter circuit may be turned off while application of such a voltage that the avalanche multiplication is generated is kept.

According to the present exemplary embodiment, a light shielding film 52 made of a metal is formed in a region overlapped with the charge multiplication section 50 on the upper surface of the semiconductor substrate. With this configuration, a situation can be avoided where the signal charge is generated in the charge multiplication section 50 and read out by the counter circuit.

In addition, according to the present exemplary embodiment, a negative fixed charge film 51 is arranged on the upper surface of the substrate. This is because the depletion in the semiconductor substrate interface section is avoided to reduce the dark current.

Sixth Exemplary Embodiment

Figure 19:
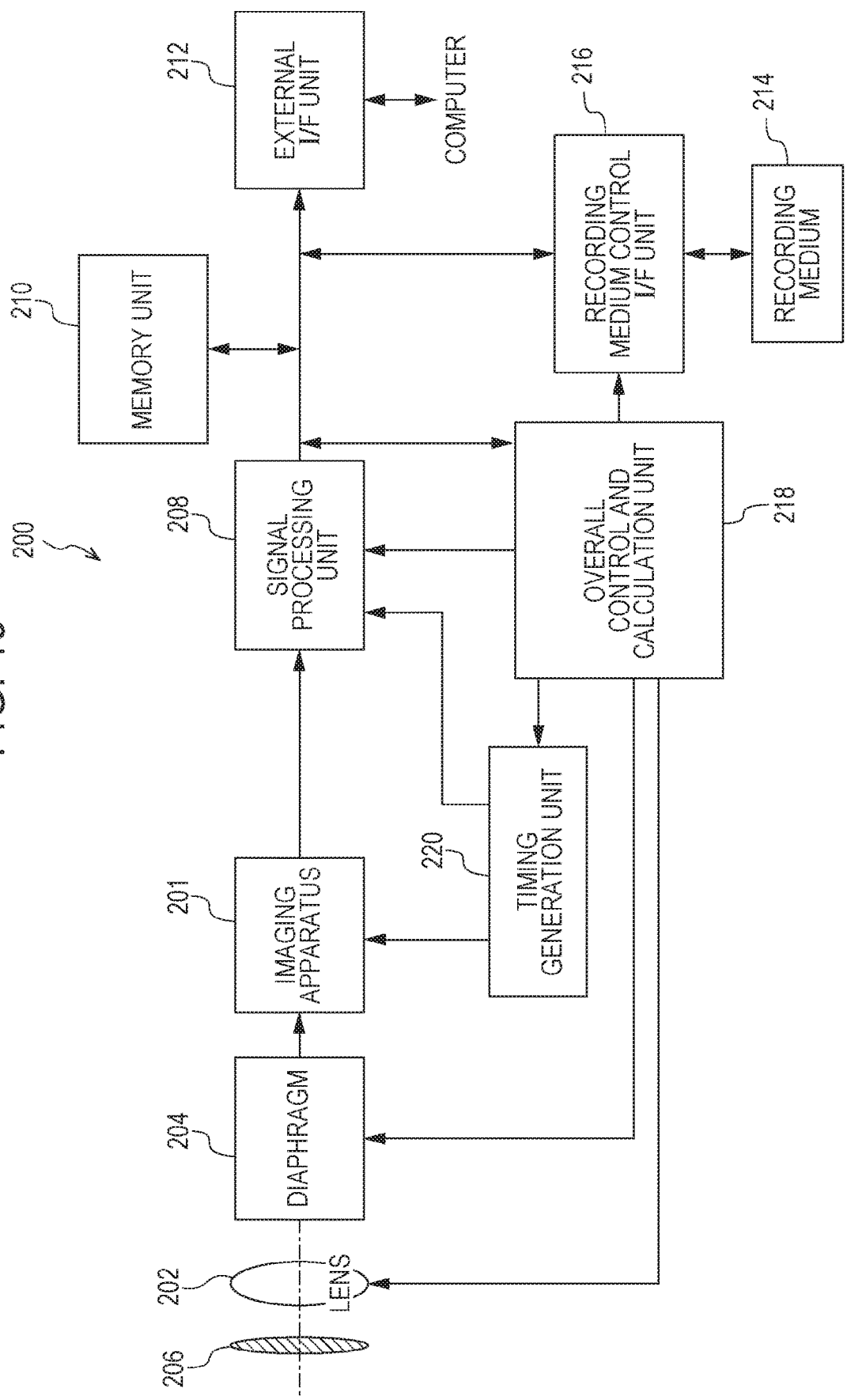
FIG. 19 is a block diagram illustrating a schematic configuration of an imaging system according to a sixth exemplary embodiment.

An imaging system according to the present exemplary embodiment will be described with reference to FIG. 19. The components similar to the light detection apparatus according to the above-described respective exemplary embodiments are assigned with the same reference symbols, and descriptions thereof will be omitted or simplified. FIG. 19 is a block diagram illustrating a schematic configuration of the imaging system according to the present exemplary embodiment.

The light detection apparatus described according to the above-described respective exemplary embodiments can be applied to various imaging systems functioning as an imaging apparatus 201 in FIG. 19. A digital still camera, a digital camcorder, a security camera, a copier, a facsimile device, a mobile phone, an on-vehicle camera, an observation satellite, and the like are exemplified as the applicable imaging system. A camera module including an optical system such as a lens and the imaging apparatus is also included in the imaging system. A block diagram of the digital still camera is exemplified in FIG. 19 as an example of these devices.

An imaging system 200 exemplified in FIG. 19 includes the imaging apparatus 201, a lens 202 for forming an optical image of a subject on the imaging apparatus 201, a diaphragm 204 for causing the amount of light to pass through the lens 202 to be variable, and a barrier 206 for protecting the lens 202. The lens 202 and the diaphragm 204 are an optical system in which light is focused on the imaging apparatus 201. The imaging apparatus 201 is the light detection apparatus described according to the first to fifth exemplary embodiments and converts the optical image formed by the lens 202 into image data.

The imaging system 200 also includes a signal processing unit 208 configured to perform processing on an output signal output from the imaging apparatus 201. The signal processing unit 208 performs analog-to-digital conversion for converting an analog signal output by the imaging apparatus 201 into a digital signal. The signal processing unit 208 also performs an operation for outputting the image data by performing various corrections and compressions when necessary in addition to the analog-to-digital conversion. An analog-to-digital conversion unit corresponding to part of the signal processing unit 208 may be formed on the semiconductor substrate where the imaging apparatus 201 is provided or may also be formed another semiconductor substrate different from that for the imaging apparatus 201. In addition, the imaging apparatus 201 and the signal processing unit 208 may be formed on the same semiconductor substrate.

The imaging system 200 further includes a memory unit 210 configured to temporarily store the image data and an external interface unit (external I/F unit) 212 for communicating with an external computer or the like. The imaging system 200 further includes a recording medium 214 such as a semiconductor memory for recording or reading out imaging data and a recording medium control interface (recording medium control I/F unit) 216 for performing recording or readout with respect to the recording medium 214. It should be noted that the recording medium 214 may be built in the imaging system 200 or may also be detachably attached.

The imaging system 200 further includes an overall control and calculation unit 218 configured to perform various calculations and control the entirety of the digital still camera, and a timing generation unit 220 configured to output various timing signals to the imaging apparatus 201 and the signal processing unit 208. Herein, the timing signals and the like may be input from the outside, and it is sufficient when the imaging system 200 includes at least the imaging apparatus 201 and the signal processing unit 208 configured to process an output signal from the imaging apparatus 201.

The imaging apparatus 201 outputs an imaging signal to the signal processing unit 208. The signal processing unit 208 implements predetermined signal processing on the imaging signal output from the imaging apparatus 201 and outputs the image data. The signal processing unit 208 generates an image by using an imaging signal.

In accordance with the application of the light detection apparatus according to the above-described respective exemplary embodiments, it is possible to realize the stably highly sensitive imaging system that may obtain the image having the satisfactory quality with the high saturated signal amount.

Seventh Exemplary Embodiment

An imaging system and a movable body according to the present exemplary embodiment will be described with reference to FIGS. 20A and 20B.

Figure 20A:
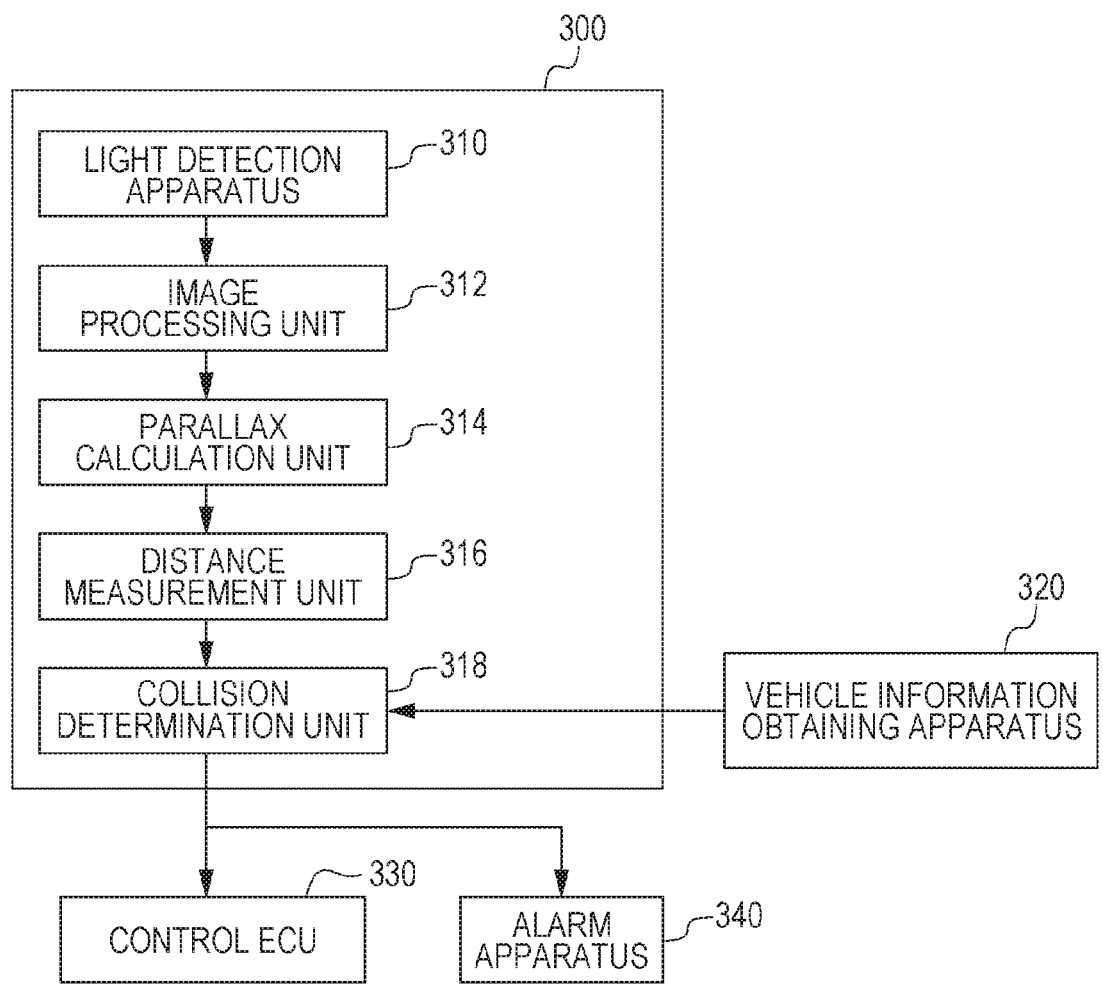
FIGS. 20A and 20B illustrate a configuration example of the imaging system and a movable body according to a seventh exemplary embodiment.
Figure 20B:
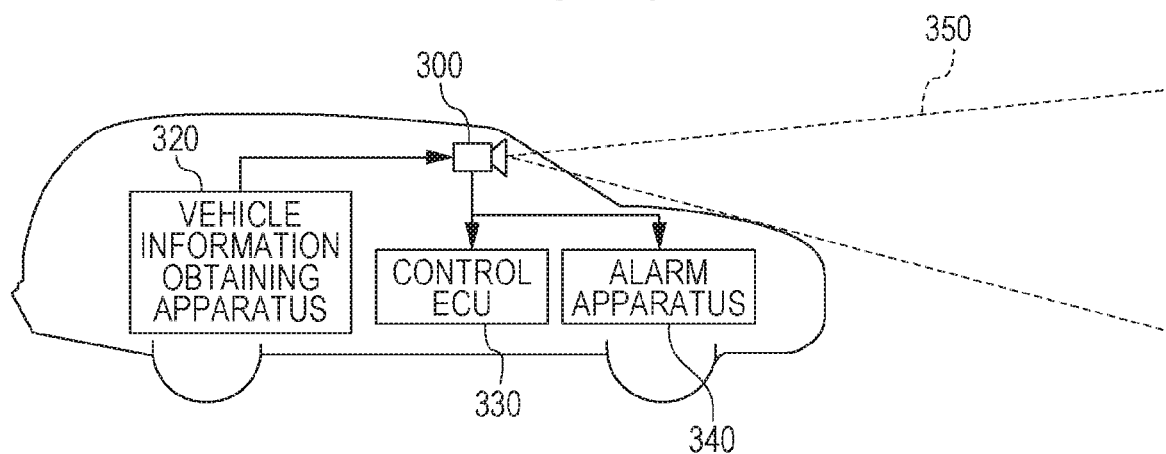

FIG. 20A schematically illustrates an example of an imaging system related to on-vehicle camera. An imaging system 300 includes an imaging apparatus functioning as a light detection apparatus 310. The light detection apparatus (imaging apparatus) 310 is the light detection apparatus described in any one of the first to fifth exemplary embodiments. The imaging system 300 includes an image processing unit 312 configured to perform image processing on plural pieces of image data obtained by the light detection apparatus 310 and a parallax calculation unit 314 configured to calculate a parallax (phase difference of parallax images) from the plural pieces of image data obtained by the imaging system 300. The imaging system 300 also includes a distance measurement unit 316 configured to calculate a distance to a target on the basis of the calculated parallax and a collision determination unit 318 configured to determine whether there is a possibility that a collision may occur on the basis of the calculated distance. Herein, the parallax calculation unit 314 and the distance measurement unit 316 are examples of a distance information obtaining unit configured to obtain distance information to a target object. That is, the distance information is information related to parallax, a de-focus amount, a distance to the target object, and the like. The collision determination unit 318 may determine the collision probability by using any one of these pieces of distance information. The distance information obtaining unit may be realized by dedicatedly designed hardware or a software module. The distance information obtaining unit may also be realized by a field programmable gate array (FPGA), an application specific integrated circuit (ASIC), or the like and may be realized by a combination of these.

The imaging system 300 is connected to a vehicle information obtaining apparatus 320 and can detect vehicle information such as a vehicle speed, a yaw rate, and a rudder angle. A control ECU 330 functioning as a control apparatus configured to output a control signal for generating braking force to a vehicle is connected to the imaging system 300 on the basis of the determination result in the collision determination unit 318. The imaging system 300 is also connected to an alarm apparatus 340 configured to issue an alarm to a driver on the basis of the determination result in the collision determination unit 318. For example, in a case where a collision probability is high as the determination result of the collision determination unit 318, the control ECU 330 performs vehicle control for avoiding the collision or alleviating damages by applying brake, returning an accelerator, and suppressing an engine output. The alarm apparatus 340 issues an alarm to a user by emitting an alarm such as sound, displaying alarm information on a screen of a car navigation system or the like, and supplying vibration to a seat belt or steering, for example.

According to the present exemplary embodiment, surrounding of the vehicle such as, for example, a forward area or a backward area is captured by the imaging system 300. FIG. 20B illustrates an imaging system in a case where the forward area in front of the vehicle (imaging range 350) is captured. The vehicle information obtaining apparatus 320 transmits an instruction to the imaging system 300 or the light detection apparatus 310 so as to perform a predetermined operation. In accordance with the above-described configuration, ranging accuracy can be further improved.

An example of the control for avoiding the collision with the other vehicle has been described above, but the technology can be applied to control for following the other vehicle to perform automated driving, control for the automated driving without drifting from a lane, or the like. Furthermore, the imaging system can be applied to not only the vehicle such as an automobile but also a movable body (movable apparatus) such as, for example, a vessel, aircraft, or industrial robot. In addition, the imaging system can be widely applied to not only the movable body but also a device using object recognition such as an intelligent transport system (ITS).

Modified Examples

Not only the above-described exemplary embodiments but also various modifications can be made with regard to the present invention. For example, exemplary embodiments of the present invention also include an example in which part of the configurations according to any one of the exemplary embodiments is added to the other exemplary embodiment and an example in which the configuration is replaced with part of the configuration according to the other exemplary embodiment.

It should be noted that the above-described exemplary embodiments are all merely examples of the specified configurations for carrying out the present invention, and the technical scope of the present invention is not be restrictively interpreted by these exemplifications. That is, the exemplary embodiments of the present invention can be carried out in various modes without departing from its technical concept or its main features.

Advantages Effects of Invention

According to the exemplary embodiments of the present invention, it is possible to reduce the noise in the light detection apparatus that uses the SPAD, in particular, the light detection apparatus that accumulates and outputs the signal charge.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-175251, filed Sep. 19, 2018, which is hereby incorporated by reference herein in its entirety.

What is claimed is:

1. A light detection apparatus comprising:
a first semiconductor region having a first conductivity type in which carriers having a first polarity that is the same polarity as that of a signal charge are set as majority carriers;
a second semiconductor region having a second conductivity type in which carriers having a second polarity are set as majority carriers; and
a third semiconductor region having the first conductivity type where the signal charge is transferred from the first semiconductor region,
wherein a reverse bias voltage for causing avalanche multiplication of the signal charge is applied to the second semiconductor region and the third semiconductor region,
a potential barrier having a height lower than the reverse bias voltage with respect to the signal charge in the first semiconductor region is formed between the first semiconductor region and the third semiconductor region, and
the signal charge is accumulated in the first semiconductor region by forming the potential barrier,
wherein the light detection apparatus comprises a control unit configured to transfer the signal charge in the first semiconductor region to the third semiconductor region in a manner that the height of the potential barrier is controlled; and
a circuit unit configured to count the number of generation times of an avalanche current generated by the avalanche multiplication.

2. The light detection apparatus according to claim 1, further comprising:
a waveform shaping unit configured to shape a waveform by detecting the avalanche current generated by the avalanche multiplication,
wherein the circuit unit counts the number of generation times of the avalanche current detected by the waveform shaping unit.

3. The light detection apparatus according to claim 1, wherein
a plurality of photoelectric conversion units are arranged, each photoelectric conversion unit including the first semiconductor region, the second semiconductor region, the third semiconductor region, and the control unit, and
the single circuit unit is connected to the single photoelectric conversion unit.

4. The light detection apparatus according to claim 1, wherein
a plurality of photoelectric conversion units are arranged, each photoelectric conversion unit including the first semiconductor region, the second semiconductor region, the third semiconductor region, and the control unit, and
the single circuit unit is connected to the plurality of photoelectric conversion units.

5. The light detection apparatus according to claim 2, wherein the control unit controls the height of the potential barrier within such a range that the avalanche multiplication of the signal charge does not occur.

6. The light detection apparatus according to claim 2, wherein
a period in which the signal charge is accumulated in the first semiconductor region by setting the potential barrier to have a first height, and
a period in which the signal charge is transferred from the first semiconductor region to the third semiconductor region by setting the potential barrier to be lower than the first height are prepared.

7. The light detection apparatus according to claim 6, wherein the height of the potential barrier is changed in a slope manner in the period in which the signal charge is transferred.

8. The light detection apparatus according to claim 6, wherein the height of the potential barrier is changed in a step manner in the period in which the signal charge is transferred.

9. The light detection apparatus according to claim 6, wherein the control unit controls the height of the potential barrier by controlling a potential supplied to the second semiconductor region.

10. The light detection apparatus according to claim 9, wherein
a period in which the signal charge is accumulated in the first semiconductor region by supplying a first potential to the second semiconductor region through the control unit, and
a period in which the signal charge is transferred from the first semiconductor region to the third semiconductor region by supplying a second potential that is different from the first potential to the second semiconductor region through the control unit are prepared.

11. The light detection apparatus according to claim 1, wherein
a fourth semiconductor region having the second conductivity type is arranged to surround the first semiconductor region, and
a potential of the first semiconductor region is changed to lower the height of the potential barrier by a change a potential of the fourth semiconductor region by the control unit.

12. The light detection apparatus according to claim 11, wherein, when the control unit changes the potential of the fourth semiconductor region, a change amount of the potential in the fourth semiconductor region is higher than a change amount of a potential in a region where a depletion layer is formed in the second semiconductor region.

13. The light detection apparatus according to claim 2, wherein the second semiconductor region is continuously arranged on a surface of the first semiconductor region at a side of the third semiconductor region.

14. The light detection apparatus according to claim 2, wherein a gap is formed between a first portion of the second semiconductor region and a second portion of the second semiconductor region between the first semiconductor region and the third semiconductor region.

15. The light detection apparatus according to claim 1, wherein
a gate electrode is arranged in a region overlapped with the second semiconductor region in a plane view, and
a potential supplied to the gate electrode is changed to change the height of the potential barrier.

16. The light detection apparatus according to claim 1, further comprising:
a fifth semiconductor region having the first conductivity type where the signal charge is generated; and
a sixth semiconductor region having the second conductivity type which is arranged between the fifth semiconductor region and the sixth semiconductor region, wherein
a gate electrode is arranged to be overlapped with the fifth semiconductor region and the sixth semiconductor region in a plane view, and
a potential supplied to the gate electrode is changed to change a potential of the first semiconductor region and lower the potential barrier.

17. The light detection apparatus according to claim 16, wherein the potential supplied to the gate electrode is changed to transfer the signal charge from the fifth semiconductor region to the first semiconductor region.

18. The light detection apparatus according to claim 6, wherein the period in which the signal charge is transferred is shorter than the period in which the signal charge is accumulated.

19. The light detection apparatus according to claim 18, wherein
the reverse bias voltage for causing the avalanche multiplication of the signal charge is applied to the third semiconductor region during part of the period in which the signal charge is transferred, and
the reverse bias voltage having a magnitude for causing no avalanche multiplication is applied to the third semiconductor region in the period in which the signal charge is accumulated.

20. The light detection apparatus according to claim 19, wherein
the third semiconductor region and the waveform shaping unit are connected to each other,
the waveform shaping unit and the circuit unit are connected to each other, and
the waveform shaping unit shapes the waveform, and the circuit unit counts the number of generation times in the period in which the signal charge is transferred.

21. The light detection apparatus according to claim 20, wherein
the third semiconductor region and the waveform shaping unit are connected to each other,
the waveform shaping unit and the circuit unit are connected to each other, and
at least one of the waveform shaping unit and the circuit unit does not operate in the period in which the signal charge is accumulated.

22. The light detection apparatus according to claim 1, further comprising:
a seventh semiconductor region having the first conductivity type and an impurity concentration lower than that of the third semiconductor region, the seventh semiconductor region being arranged between the second semiconductor region and the third semiconductor region.

23. The light detection apparatus according to claim 1, further comprising:
an eighth semiconductor region having the second conductivity type, wherein
the first semiconductor region constitutes a part of a surface of a semiconductor substrate, and
the eighth semiconductor region constitutes another part of the surface of the semiconductor substrate, and the first semiconductor region and the eighth semiconductor region are separated from each other in a plane view.

24. A photoelectric conversion system comprising:
the light detection apparatus according to claim 1; and
a processing apparatus configured to process a signal output from the light detection apparatus.

25. A movable body comprising:
the light detection apparatus according to claim 1;
a movable apparatus;
a processing apparatus configured to obtain information from a signal output from the light detection apparatus; and
a control apparatus configured to control the movable apparatus on a basis of the information.

* * * * *